(12) United States Patent
Samadiani et al.

(10) Patent No.: US 9,961,803 B2
(45) Date of Patent: *May 1, 2018

(54) COOLING ELECTRONIC DEVICES IN A DATA CENTER

(71) Applicant: Google LLC, Mountain View, CA (US)

(72) Inventors: Emad Samadiani, Mountain View, CA (US); Eehern J. Wong, Sunnyvale, CA (US); Gregory P. Imwalle, Mountain View, CA (US); Soheil Farshchian, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/359,154

(22) Filed: Nov. 22, 2016

(65) Prior Publication Data
US 2017/0079167 A1    Mar. 16, 2017

Related U.S. Application Data

(63) Continuation of application No. 14/492,216, filed on Sep. 23, 2014, now Pat. No. 9,552,025.

(51) Int. Cl.
*H05K 7/20* (2006.01)
*G06F 1/20* (2006.01)

(52) U.S. Cl.
CPC ........... *H05K 7/20809* (2013.01); *G06F 1/20* (2013.01); *H05K 7/20318* (2013.01);
(Continued)

(58) Field of Classification Search
CPC ............ H05K 7/20809; H05K 7/2033; H05K 7/20327; H05K 17/20318; H05K 7/20836; G06F 2200/201
See application file for complete search history.

(56) References Cited

U.S. PATENT DOCUMENTS

| 6,477,847 | B1 | 11/2002 | Bonaquist et al. |
| 6,549,408 | B2 * | 4/2003 | Berchowitz ......... F28D 15/0266 165/80.4 |

(Continued)

FOREIGN PATENT DOCUMENTS

| CN | 101247712 | 8/2008 |
| EP | 1669710 | 6/2006 |

(Continued)

OTHER PUBLICATIONS

British Office Action issued in Great Britain Application No. GB1621540.2, dated Jul. 13, 2017, 6 pages.
(Continued)

*Primary Examiner* — Emmanuel Duke
(74) *Attorney, Agent, or Firm* — Fish & Richardson P.C.

(57) ABSTRACT

A data center cooling system includes a thermosiphon, an actuator coupled to the thermosiphon, and a controller. The thermosiphon includes an evaporator; a condenser; and at least one conduit coupled between the evaporator and the condenser to transport a working fluid between the evaporator and the condenser. The controller is coupled to the actuator and configured to operate the actuator to adjust a liquid level of the working fluid in the evaporator based, at least in part, on a parameter associated with a heat load of one or more data center heat generating computing devices.

20 Claims, 12 Drawing Sheets

(52) U.S. Cl.
CPC ..... *H05K 7/20327* (2013.01); *H05K 7/20336* (2013.01); *H05K 7/20836* (2013.01); *G06F 2200/201* (2013.01)

(56) References Cited

U.S. PATENT DOCUMENTS

| | | | |
|---|---|---|---|
| 6,550,255 B2 | 4/2003 | Rudick et al. | |
| 8,773,854 B2 | 7/2014 | Rice et al. | |
| 2005/0217829 A1 | 10/2005 | Belits | |
| 2009/0071630 A1 | 3/2009 | Weber | |
| 2009/0154104 A1 | 6/2009 | Kondo et al. | |
| 2012/0180993 A1* | 7/2012 | Yoshikawa | H01L 23/427 165/104.21 |
| 2014/0014303 A1* | 1/2014 | Rice | H05K 7/20809 165/104.21 |
| 2014/0090814 A1* | 4/2014 | Kondou | F28D 15/02 165/104.21 |

FOREIGN PATENT DOCUMENTS

| | | |
|---|---|---|
| EP | 2927778 | 10/2015 |
| JP | 2013065227 | 4/2013 |
| WO | 2002077547 | 10/2002 |
| WO | 2007012108 | 2/2007 |
| WO | 2014087635 | 6/2014 |
| WO | 2015004920 | 1/2015 |

OTHER PUBLICATIONS

Jeremy Rice et al., U.S. Appl. No. 14/137,258, filed Dec. 20, 2013, 42 pages.
Invitation to Pay Additional Fees and, Where Applicable, Protest Fees for International Application No. PCT/US2015/048290, dated Nov. 13, 2015, 6 pages.
International Search Report and Written Opinion in International Application No. PCT/US2015/048290, dated Jan. 18, 2016, 18 pages.
International Preliminary Report on Patentability in International Application No. PCT/US2015/048290, dated Mar. 28, 2017, 12 pages.
Chinese Office Action issued in Chinese Application No. 201580035603.8, dated Oct. 16, 2017, 12 pages.
British Office Action issued in Great Britain Application No. GB1621540.2, dated Nov. 23, 2017, 5 pages.

* cited by examiner

COOLING ELECTRONIC DEVICES IN A DATA CENTER

CROSS-REFERENCE TO RELATED APPLICATION

This application is a continuation of, and claims priority under 35 U.S.C. § 120 to, U.S. patent application Ser. No. 14/494,216, filed Sep. 23, 2014, and entitled "Cooling Electronic Devices in a Data Center," the entire contents of which are incorporated herein by reference.

TECHNICAL FIELD

This document relates to systems and methods for providing cooling to electronic equipment, such as computer server racks and related equipment in computer data centers, with a thermosiphon.

BACKGROUND

Computer users often focus on the speed of computer microprocessors (e.g., megahertz and gigahertz). Many forget that this speed often comes with a cost—higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, networking devices, and other heat generating devices) that are located on a server or network rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

Thermosiphons are heat exchangers that operate using a fluid that undergoes a phase change. A liquid form of the fluid is vaporized in an evaporator, and heat is carried by the vapor form of the fluid from the evaporator to a condenser. In the condenser, the vapor condenses, and the liquid form of the fluid is then returned via gravity to the evaporator. Thus, the fluid circulates between the evaporator and the condenser without need of a mechanical pump.

SUMMARY

This disclosure describes a cooling system, for example, for rack mounted electronic devices (e.g., servers, processors, memory, networking devices or otherwise) in a data center. In various disclosed implementations, the cooling system includes a thermosiphon system that includes a condenser, evaporator, and conduit fluidly coupled therebetween. The thermosiphon system is thermally coupled to the electronic devices such that heat generated by such devices is transferred to a working fluid in the evaporator, vaporizing the working fluid. The vaporized working fluid moves to the condenser, where it releases the transferred heat (e.g., to air or airflow around the condenser) and condenses to a liquid. The thermosiphon system, or a part thereof, is adjustable based on a sensed or measured parameter that is associated with a heat load or power load of the electronic devices. In some implementations, one or more components of the thermosiphon system are adjustable to adjust and/or maintain a liquid level of the working fluid in the evaporator based, at least in part, on the sensed or measured parameter.

In an example implementation, a data center cooling system includes a thermosiphon, an actuator coupled to the thermosiphon, and a controller. The thermosiphon includes an evaporator; a condenser; and at least one conduit coupled between the evaporator and the condenser to transport a working fluid between the evaporator and the condenser. The controller is coupled to the actuator and configured to operate the actuator to adjust a liquid level of the working fluid in the evaporator based, at least in part, on a parameter associated with a heat load of one or more data center heat generating computing devices.

In a first aspect combinable with the general implementation, the actuator includes a height adjustment assembly coupled to the condenser.

In a second aspect combinable with any of the previous aspects, the height adjustment assembly is mounted to the condenser and arranged to adjust a position of the condenser to adjust a vertical distance between the condenser and the evaporator based, at least in part, on the parameter.

In a third aspect combinable with any of the previous aspects, the height adjustment assembly is mounted to the condenser and arranged to vibrate the condenser based, at least in part, on the parameter.

In a fourth aspect combinable with any of the previous aspects, a combination of the controller and the height adjustment assembly is arranged as a bimetallic member in contact with at least one of the condenser or the conduit, and the bimetallic member is arranged to adjust a position of the condenser to adjust a vertical distance between the condenser and the evaporator based, at least in part, on the parameter. The parameter includes a temperature difference between a temperature of the condenser or the conduit and a reference temperature.

In a fifth aspect combinable with any of the previous aspects, a combination of the controller and the height adjustment assembly is arranged as a phase change motor in contact with the condenser, and the phase change motor is arranged to adjust a position of the condenser to adjust a vertical distance between the condenser and the evaporator based, at least in part, on the parameter. The parameter includes a temperature of the condenser relative to a temperature of a phase change material of the phase change motor.

In a sixth aspect combinable with any of the previous aspects, the actuator includes a piston mounted in a working volume of the condenser.

In a seventh aspect combinable with any of the previous aspects, the piston is arranged to oscillate in the condenser to adjust the working volume based, at least in part, on the parameter.

In an eighth aspect combinable with any of the previous aspects, the piston is arranged to vibrate the condenser based, at least in part, on the parameter.

In a ninth aspect combinable with any of the previous aspects, the actuator includes an angular adjustment assembly coupled to the condenser.

In a tenth aspect combinable with any of the previous aspects, the angular adjustment assembly is mounted to the condenser and arranged to rotate or pivot the condenser based, at least in part, on the parameter.

In an eleventh aspect combinable with any of the previous aspects, the angular adjustment assembly is arranged to vibrate the condenser based, at least in part, on the parameter.

In a twelfth aspect combinable with any of the previous aspects, the conduit includes a liquid line and a vapor line, and the actuator includes a valve positioned in the liquid line.

In a thirteenth aspect combinable with any of the previous aspects, the valve is arranged to modulate toward a closed position or an open position based, at least in part, on the parameter.

In a fourteenth aspect combinable with any of the previous aspects, the actuator includes a vibration assembly coupled to the condenser and arranged to vibrate the condenser based, at least in part, on the parameter.

In a fifteenth aspect combinable with any of the previous aspects, the conduit couples the evaporator and the condenser at a downward angle relative to gravity from the condenser to the evaporator.

In a sixteenth aspect combinable with any of the previous aspects, the conduit is flexible.

In a seventeenth aspect combinable with any of the previous aspects, the parameter includes at least one of: a temperature of air adjacent the rack-mounted device, a temperature of air adjacent the condenser, a temperature of the one or more data center heat generating computing devices, a temperature of a motherboard that supports the one or more data center heat generating computing devices, the liquid level of the working fluid in the evaporator, a pressure of the working fluid, a temperature of the working fluid, a power usage of the one or more data center heat generating computing devices, a frequency of the one or more data center heat generating computing devices, or a utilization of the one or more data center heat generating computing devices.

An eighteenth aspect combinable with any of the previous aspects further includes a wicking material mounted in the conduit between the condenser and the evaporator.

In a nineteenth aspect combinable with any of the previous aspects, the evaporator includes a base and a case that define a chamber for the working fluid; and a plurality of fins integrally formed with the base that extend into the chamber from the base.

In another generation implementation, a method for cooling heat generating devices in a data center includes circulating a working fluid between an evaporator of a thermosiphon and a condenser of the thermosiphon in a downwardly angled conduit that fluidly couples the evaporator and the condenser, where the working fluid includes a gas when circulated from the evaporator to the condenser and a liquid when circulated from the condenser to the evaporator; cooling, based on the circulating, one or more heat generating devices in thermal communication with the evaporator; determining a parameter associated with a heat load of at least one of the heat generating devices; and based at least in part on the measured parameter, operating an actuator coupled to the thermosiphon to adjust a liquid level of the working fluid in the evaporator.

In a first aspect combinable with the general implementation, operating an actuator includes operating a height adjustment assembly coupled to the condenser to adjust a position of the condenser to adjust a vertical distance between the condenser and the evaporator based, at least in part, on the determined parameter.

In a second aspect combinable with any of the previous aspects, operating the actuator further includes operating the height adjustment assembly to vibrate the condenser based, at least in part, on the determined parameter.

In a third aspect combinable with any of the previous aspects, operating an actuator includes adjusting a position of the condenser with a bimetallic member in contact with at least one of the condenser or the conduit to adjust a vertical distance between the condenser and the evaporator based, at least in part, on the determined parameter. The determined parameter includes a temperature difference between a temperature of the condenser or the conduit and a reference temperature.

In a fourth aspect combinable with any of the previous aspects, operating an actuator includes adjusting a position of the condenser with a phase change motor in contact with the condenser, the phase change motor arranged to adjust a position of the condenser to adjust a vertical distance between the condenser and the evaporator based, at least in part, on the determined parameter. The determined parameter includes a temperature of the condenser relative to a temperature of a phase change material of the phase change motor.

In a fifth aspect combinable with any of the previous aspects, operating an actuator includes moving a piston mounted in a working volume of the condenser to adjust the working volume based, at least in part, on the determined parameter.

In a sixth aspect combinable with any of the previous aspects, operating the actuator further includes vibrating the condenser with the piston based, at least in part, on the determined parameter.

In a seventh aspect combinable with any of the previous aspects, operating an actuator includes rotating or pivoting the condenser with an angular adjustment assembly coupled to the condenser based, at least in part, on the determined parameter.

In an eighth aspect combinable with any of the previous aspects, operating the actuator further includes vibrating the condenser with the angular adjustment assembly based, at least in part, on the determined parameter.

In a ninth aspect combinable with any of the previous aspects, the conduit includes a liquid line and a vapor line, and the actuator includes a valve positioned in the liquid line.

In a tenth aspect combinable with any of the previous aspects, operating an actuator includes modulating the valve based, at least in part, on the determined parameter.

In an eleventh aspect combinable with any of the previous aspects, operating an actuator includes vibrating the condenser based, at least in part, on the determined parameter.

In a twelfth aspect combinable with any of the previous aspects, the parameter includes at least one of: a temperature of air adjacent the rack-mounted device, a temperature of air adjacent the condenser, a temperature of the heat generating device, a temperature of a surface that supports the heat generating device, the liquid level of the working fluid in the evaporator, a pressure of the working fluid, a temperature of the working fluid, a power usage of the heat generating device, a frequency of the heat generating device, or a utilization of the heat generating device.

In another general implementation, a thermosiphon cooling system for a rack-mounted device in a data center includes an evaporator; a condenser fluidly coupled to the evaporator with a fluid pathway that slopes downward from the condenser to the evaporator; a working fluid enclosed within the evaporator, the condenser, and the fluid pathway; means for determining at least one parameter associated with an amount of heat generated by the rack-mounted device; and means for adjusting a liquid level of the working fluid in the evaporator based, at least in part, on the parameter associated with the amount of heat generated by the rack-mounted device.

In a first aspect combinable with the general implementation, the means for adjusting a liquid level of the working fluid in the evaporator includes means for vibrating the condenser.

In a second aspect combinable with any of the previous aspects, the means for adjusting a liquid level of the working fluid in the evaporator includes means for adjusting a vertical distance between the condenser and the evaporator.

In a third aspect combinable with any of the previous aspects, the means for adjusting a liquid level of the working fluid in the evaporator includes means for adjusting a rate of liquid flowing in the fluid pathway from the condenser to the evaporator.

In a fourth aspect combinable with any of the previous aspects, the parameter includes at least one of: a temperature of air adjacent the rack-mounted device, a temperature of air adjacent the condenser, a temperature of the rack-mounted device, a temperature of a surface that supports the rack-mounted device, the liquid level of the working fluid in the evaporator, a pressure of the working fluid, a temperature of the working fluid, the power usage of the rack-mounted device, a frequency of the rack-mounted device, or a utilization of the rack-mounted device.

A fifth aspect combinable with any of the previous aspects further includes a fan positioned to circulate an airflow over the condenser.

A sixth aspect combinable with any of the previous aspects further includes one or more heat transfer surfaces mounted to the condenser.

In another general implementation, a server tray subassembly includes a motherboard; a plurality of heat generating electronic devices mounted on the motherboard; a thermosiphon mounted on the motherboard; and a control system. The thermosiphon includes an evaporator in heat transfer communication with the plurality of heat generating electronic devices; a condenser fluidly coupled to the evaporator with a fluid conduit that slopes downward from the condenser to the evaporator; and a multi-phase fluid contained in the thermosiphon. The control system includes a sensing device operable to sense a value associated with an amount of heat generated by the plurality of heat generating electronic devices; and an actuator operatively coupled to the thermosiphon to adjust an amount of the multi-phase fluid in the evaporator based, at least in part, on the sensed value.

In a first aspect combinable with the general implementation, the actuator is operatively coupled to the condenser and is configured to adjust the condenser based, at least in part, on the sensed value.

In a second aspect combinable with any of the previous aspects, the actuator is configured to adjust at least one of a vertical distance between the condenser and the evaporator; a working volume of the condenser; or an angular position of the condenser relative to the motherboard.

In a third aspect combinable with any of the previous aspects, the actuator is configured to vibrate the condenser.

In a fourth aspect combinable with any of the previous aspects, the actuator is configured to adjust a flow of a liquid phase of the multi-phase fluid from the condenser to the evaporator based, at least in part, on the sensed value.

In a fifth aspect combinable with any of the previous aspects, the actuator includes a valve arranged in a liquid line of the fluid conduit.

In a sixth aspect combinable with any of the previous aspects, the actuator includes a wicking material mounted in a liquid line of the fluid conduit.

In a seventh aspect combinable with any of the previous aspects, the conduit is flexible.

In an eighth aspect combinable with any of the previous aspects, the sensed value includes at least one of: a temperature of air adjacent the plurality of heat generating electronic devices, a temperature of air adjacent the condenser, a temperature of the plurality of heat generating electronic devices, a temperature of the motherboard, a liquid level of the multi-phase fluid in the evaporator, a pressure of the multi-phase fluid, a temperature of the multi-phase fluid, a power usage of the plurality of heat generating electronic devices, a frequency of one or more of the plurality of heat generating electronic devices, or a utilization of one or more of the plurality of heat generating electronic devices.

In another general implementation, a thermosiphon cooling system for a rack-mounted device in a data center includes an evaporator; a condenser fluidly coupled to the evaporator with a flexible fluid pathway that slopes downward from the condenser to the evaporator; and a working fluid enclosed within the evaporator, the condenser, and the fluid pathway. The evaporator includes a base; a case attachable to the base, the base and the case defining a chamber for a working fluid; and a heat transfer surface integrally formed with the base and extending from the base into the chamber.

In a first aspect combinable with the general implementation, the heat transfer surface includes a plurality of fins integrally formed with the base.

In a second aspect combinable with any of the previous aspects, the fins are sized to extend into the chamber above a liquid level of the working fluid.

In a third aspect combinable with any of the previous aspects, the fins are formed in substantially parallel rows.

In a fourth aspect combinable with any of the previous aspects, each of the fins comprise a textured outer surface.

In a fifth aspect combinable with any of the previous aspects, the textured outer surface is configured to facilitate a capillary effect of the working fluid.

In a sixth aspect combinable with any of the previous aspects, the base comprises a pan to hold liquid working fluid.

Various implementations of a data center cooling system according to the present disclosure may include one, some, or all of the following features. For example, the thermosiphon cooling system may provide for a more flexible and adaptable cooling system in response to changing cooling requirements of a server tray, components on the server tray (e.g., CPU, memory, or otherwise), a networking tray, or other rack mounted system in a data center. For example, the thermosiphon system may more accurately match the cooling requirement, thereby increasing efficiency of the cooling system while minimizing overcooling of certain components. In some example implementations, the thermosiphon cooling system may have an improved efficiency at lower required cooling powers (e.g., lower heat generated by the components). The thermosiphon cooling system may also have an increased cooling capacity at higher required cooling powers (e.g., higher heat generated by the components on the server tray). As another example, the thermosiphon cooling system may provide flexibility for us in multiple generations of heat generating components, while using the same parts and manufacturing process.

Various implementations of a data center cooling system according to the present disclosure may include one, some, or all of the following features. The thermosiphon system can fit within the limited horizontal and vertical space of the server rack. A thin layer of liquid can be maintained in the evaporator over the region where the evaporator contacts the electronic device, thus reducing thermal resistance of the evaporator to absorption of heat from the electronic device. In addition, the likelihood of flooding of this region can be reduced, thus reducing the likelihood of failure of the thermosiphon system due to increased thermal resistance.

The details of one or more embodiments are set forth in the accompanying drawings and the description below. Other features, objects, and advantages will be apparent from the description and drawings, and from the claims.

DETAILED DESCRIPTION

This document discusses a thermosiphon system that can be implemented to remove heat from an electronic device, e.g., a component of computing equipment, such as a processor or memory. The evaporator of the thermosiphon system contacts the electronic device so that the electronic device experiences a conductive heat transfer effect. Thus, the thermosiphon system can act as a heat sink for the electronic device, reducing the likelihood of overheating and subsequent failure of the electronic device. The thermosiphon system can be mounted on or integrated with a server rack sub-assembly for insertion into a server rack. The server rack sub-assembly can contain or support a number of heat-generating electronic devices, and the evaporator of the thermosiphon system can contact one or more of the electronic devices. In addition, the thermosiphon system can be mounted on a circuit card assembly, a daughter card, and/or other boards that carry heat-generating electronic devices.

In some example implementations, one or more components of the thermosiphon system can be adjusted (e.g., dynamically during operation) to adjust a liquid level of the working fluid in the evaporator to, for instance, better match a heat load generated by the electronic device. In some aspects, by matching a dynamic heat load of the electronic device, the thermosiphon system may be operated more efficiently. For example, the thermosiphon system may operate most efficiently at a "dryout" condition, where all or substantially all of the liquid working fluid in the evaporator is vaporized by heat transfer to the evaporator from the electronic device. Since the electronic device may not output a constant heat power (e.g., due to changes in operational speed, frequency, utilization, or otherwise), the thermosiphon system that is dynamically adjusted to operate at the dryout condition (or other desirable operating condition) may be more efficient.

Figure 1:
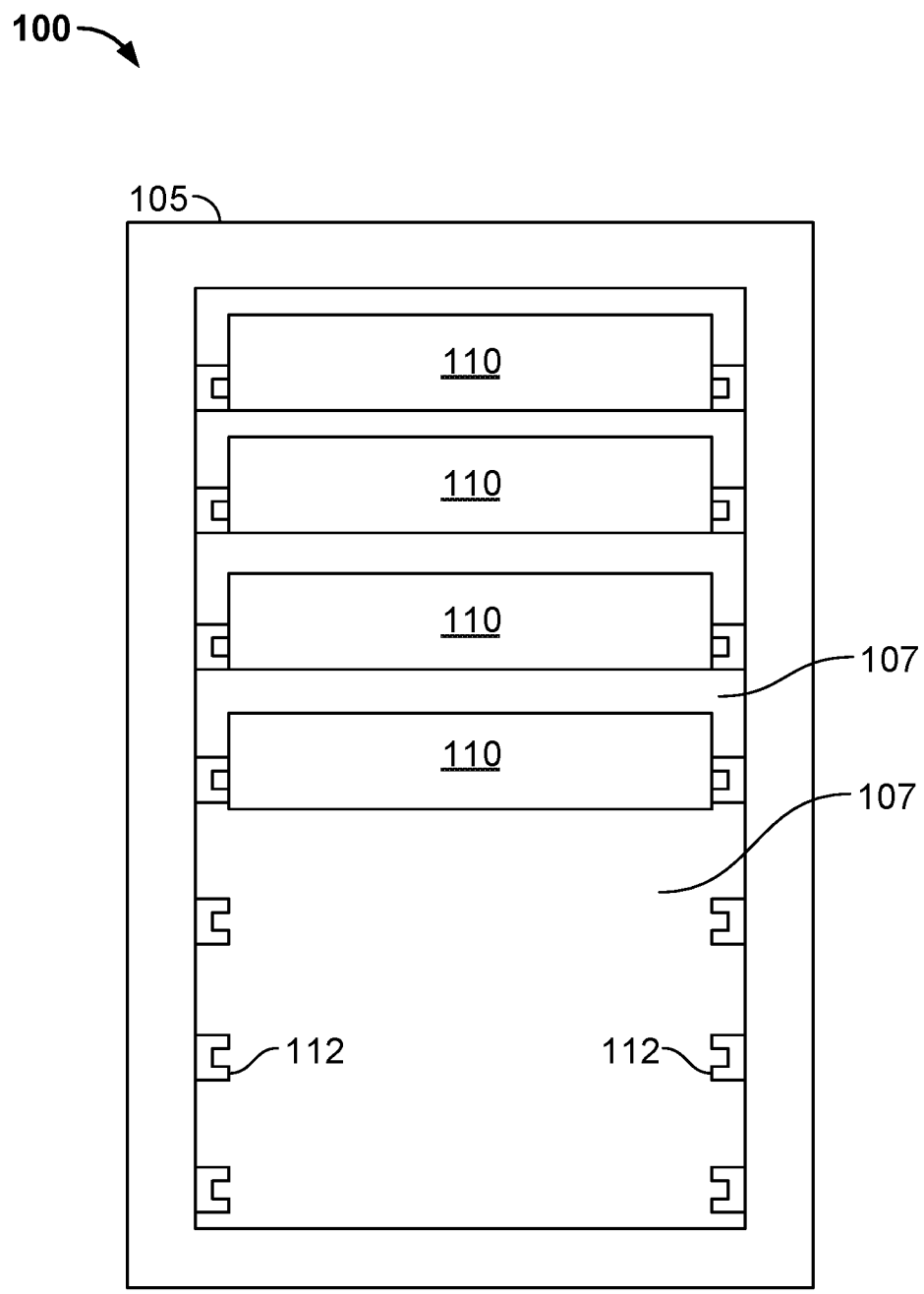
FIG. 1 illustrates a side view of a server rack and a server-rack sub-assembly configured to mount within a rack used in a data center environment.

FIG. 1 illustrates an example system 100 that includes a server rack 105, e.g., a 13 inch or 19 inch server rack, and multiple server rack sub-assemblies 110 mounted within the rack 105. Although a single server rack 105 is illustrated, server rack 105 may be one of a number of server racks within the system 100, which may include a server farm or a co-location facility that contains various rack mounted computer systems. Also, although multiple server rack sub-assemblies 110 are illustrated as mounted within the rack 105, there might be only a single server rack sub-assembly. Generally, the server rack 105 defines multiple slots 107 that are arranged in an orderly and repeating fashion within the server rack 105, and each slot 107 is a space in the rack into which a corresponding server rack sub-assembly 110 can be placed and removed. For example, the server rack sub-assembly can be supported on rails 112 that project from opposite sides of the rack 105, and which can define the position of the slots 107.

The slots 107, and the server rack sub-assemblies 110, can be oriented with the illustrated horizontal arrangement (with respect to gravity). Alternatively, the slots 107, and the server rack sub-assemblies 110, can be oriented vertically (with respect to gravity), although this would require some reconfiguration of the evaporator and condenser structures described below. Where the slots are oriented horizontally, they may be stacked vertically in the rack 105, and where the slots are oriented vertically, they may be stacked horizontally in the rack 105.

Server rack 105, as part of a larger data center for instance, may provide data processing and storage capacity. In operation, a data center may be connected to a network, and may receive and respond to various requests from the network to retrieve, process, and/or store data. In operation, for example, the server rack 105 typically facilitates the communication of information over a network with user interfaces generated by web browser applications of users who request services provided by applications running on computers in the datacenter. For example, the server rack 105 may provide or help provide a user who is using a web browser to access web sites on the Internet or the World Wide Web.

The server rack sub-assembly 110 may be one of a variety of structures that can be mounted in a server rack. For example, in some implementations, the server rack subassembly 110 may be a "tray" or tray assembly that can be slidably inserted into the server rack 105. The term "tray" is not limited to any particular arrangement, but instead applies to motherboard or other relatively flat structures appurtenant to a motherboard for supporting the motherboard in position in a rack structure. In some implementations, the server rack sub-assembly 110 may be a server chassis, or server container (e.g., server box). In some implementations, the server rack sub-assembly 110 may be a hard drive cage.

Figure 2A:
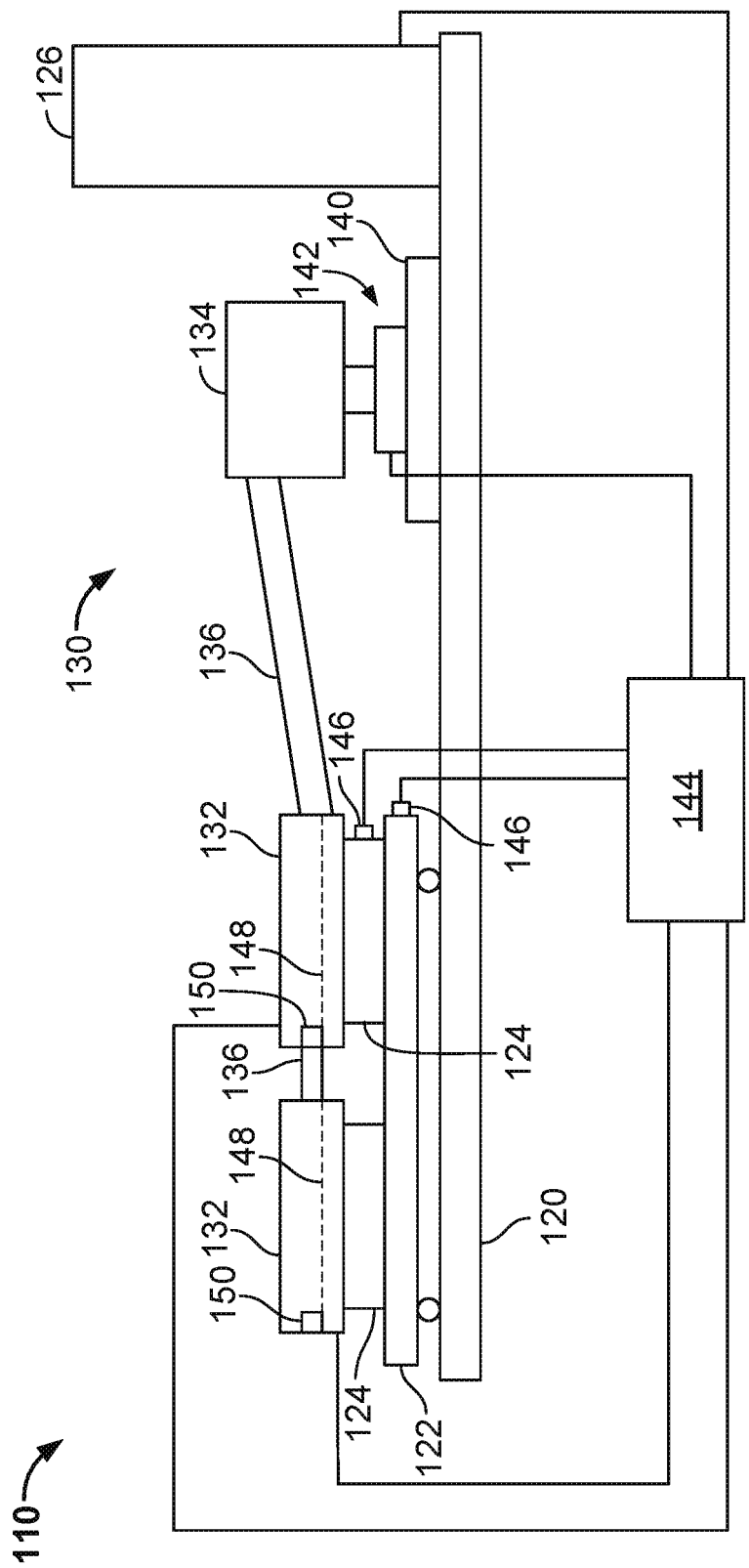
FIGS. 2A-2B illustrate schematic side and top views, respectively, of a server rack sub-assembly that includes an example implementation of a thermosiphon cooling system.
Figure 2B:
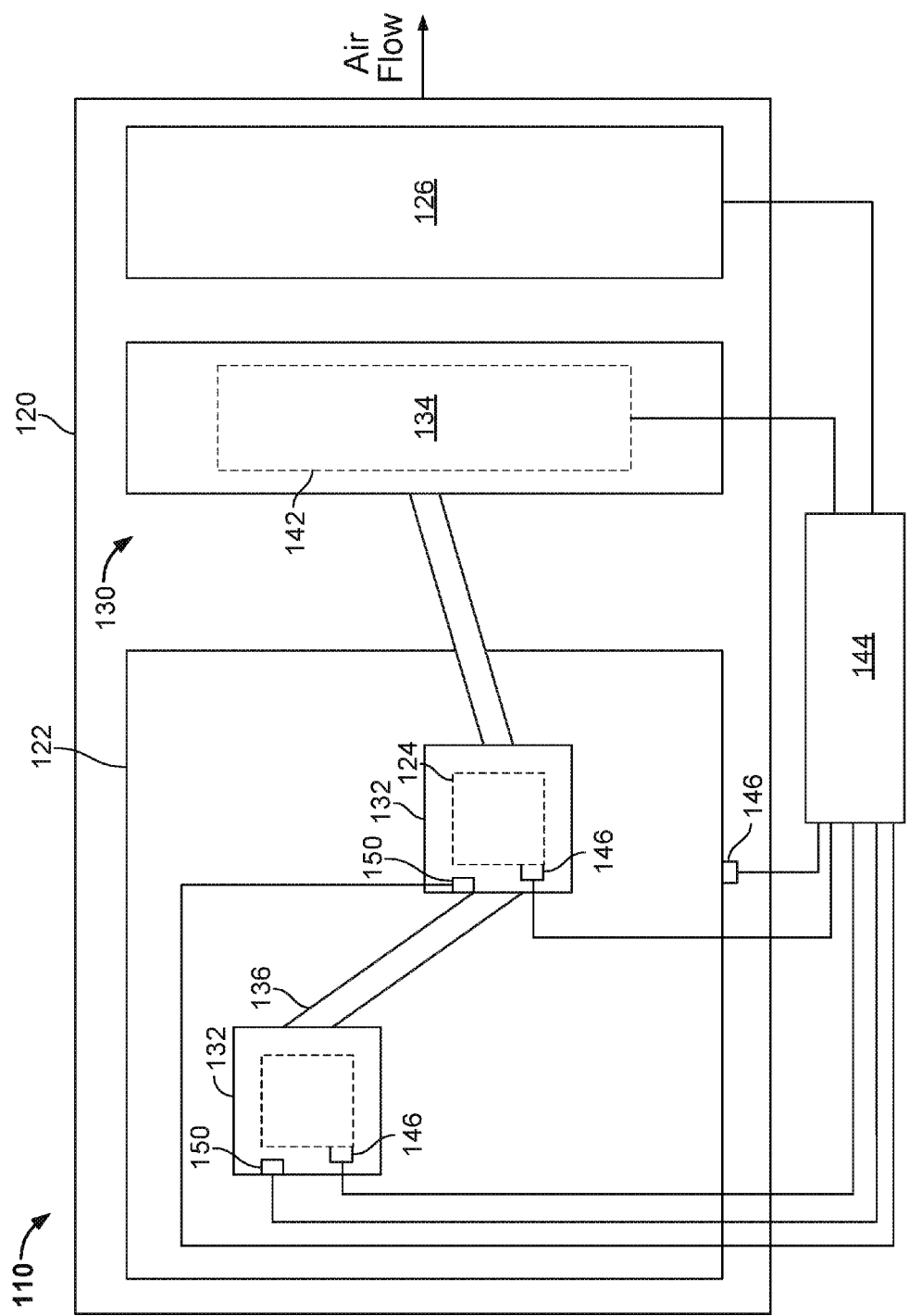

Referring to FIGS. 2A-2B, the server rack sub-assembly 110 includes a frame or cage 120, a printed circuit board 122, e.g., motherboard, supported on the frame 120, one or more heat-generating electronic devices 124, e.g., a processor or memory, mounted on the printed circuit board 122, and a thermosiphon system 130. One or more fans 126 can also be mounted on the frame 120.

The frame 120 can include or simply be a flat structure onto which the motherboard 122 can be placed and mounted, so that the frame 120 can be grasped by technicians for moving the motherboard into place and holding it in position within the rack 105. For example, the server rack sub-assembly 110 may be mounted horizontally in the server rack 105 such as by sliding the frame 120 into the slot 107 and over a pair of rails in the rack 105 on opposed sides of the server rack sub-assembly 110—much like sliding a lunch tray into a cafeteria rack. Although FIGS. 2A-2B illustrate the frame 120 extending below the motherboard 122, the frame can have other forms (e.g., by implementing it as a peripheral frame around the motherboard) or may be eliminated so that the motherboard itself is located in, e.g., slidably engages, the rack 105. In addition, although FIG. 2A illustrates the frame 120 as a flat plate, the frame 120 can include one or more side walls that project upwardly from the edges of the flat plate, and the flat plate could be the floor of a closed-top or open-top box or cage.

The illustrated server rack sub-assembly 110 includes a printed circuit board 122, e.g., a motherboard, on which a variety of components are mounted, including heat-generating electronic devices 124. Although one motherboard 122 is illustrated as mounted on the frame 120, multiple motherboards may be mounted on the frame 120, depending on the needs of the particular application. In some implementations, the one or more fans 126 can be placed on the frame 120 so that air enters at the front edge (at the left hand side in FIGS. 2A-2B) of the server rack sub-assembly 110, closer to the front of the rack 105 when the sub-assembly 110 is installed in the rack 105, flows (as illustrated) over the motherboard 122, over some of the heat generating components on the motherboard 122, and is exhausted from the server rack assembly 110 at the back edge (at the right hand side), closer to the back of the rack 105 when the sub-assembly 110 is installed in the rack 105. The one or more fans 126 can be secured to the frame 120 by brackets. Thus, the fans 126 can pull air from within the frame 120 area and push the air after it has been warmed out the rack 105. An underside of the motherboard 122 can be separated from the frame 120 by a gap.

The thermosiphon system 130 includes an evaporator 132, a condenser 134, and condensate/vapor lines 136 connecting the evaporator 132 to the condenser 134. The evaporator 132 contacts the electronic device 124 so that heat is drawn by conductive heat transfer from the electronic device 124 to the evaporator 132. For example, the evaporator 132 is in conductive thermal contact with the electronic device 124. In particular, the bottom of the evaporator 132 contacts the top of the electronic device 124. In operation, heat from the electronic device 124 causes a working fluid 148 in the evaporator 132 to evaporate. The vapor then passes through condensate/vapor lines 136 to the condenser 134. Heat is radiated away from the condenser 134, e.g., into air around the condenser 134 or into air blown or drawn by the one or more fans 126 that passes across the condenser 134, causing the working fluid 148 to condense. As shown in FIG. 2A, the condenser 134 can be located between the one or more fans 126 from the evaporator 132, but could also be located on an opposite side of one or more of fans 126 (e.g., near an edge of the sub-assembly 110).

As shown in FIG. 2A, the condensate/vapor line 136 is at a slight (non-zero) angle so that gravity causes the condensed working fluid 148 to flow back through the condensate/vapor line 136 to the evaporator 132. Thus, in some implementations, at least a portion of the condensate/vapor lines 136 is not parallel to the main surface of the frame 120. For example, the condenser-side end of the condensate/vapor line 136 can be about 1-5 mm, e.g., 2 mm, above the evaporator-side end of the condensate/vapor line 136. However, it is also possible for the condensate/vapor line 136 to be horizontal tube, or even at a slightly negative angle (although the positive angle provides an advantage of gravity improving flow of the liquid from the condenser to the evaporator). Because there can be multiple heat generating electronic devices on a single motherboard, there can be multiple evaporators on the motherboard, where each evaporator corresponds to a single electronic device. As shown in FIG. 2A, there is a first evaporator 132 and a second evaporator 132 as well as a first electronic device 124 and a second electronic device 124. The condensate/vapor line 136 connecting the first evaporator to the second evaporator can be level.

During operation, the top surface of the working fluid 148 (as a liquid) inside the condenser 134 will be above the top surface liquid height of the working fluid 148 in the evaporator 132, e.g., by 1 to 10 mm. It can be easier to achieve this with a condensate/vapor line 136 that is at a slight (positive non-zero) angle, but proper selection of the thermal and mechanical properties of the working fluid 148 in view of the expected heat transport requirements for the thermosiphon system 130 may still achieve this for a condensate/vapor line 136 that is horizontal or at a slightly negative angle. During operation, the liquid phase of a working fluid 148 can fill a bottom portion of an interior volume of the condensate/vapor line 136, with the bottom portion extending from the condenser 134 to the evaporator 132, and a vapor phase of the working fluid 148 can pass through a top portion of the interior volume of the condensate/vapor line 136, with the top portion extending from the condenser 134 to the evaporator 132.

In some implementations, the condenser 134 can be located at a height above the evaporator 132 such that a liquid phase of the working fluid 148 fills a bottom portion of an interior volume of the condensate/vapor line 136 and such that during operation a top surface of the liquid phase has at a non-zero angle relative to horizontal from the condenser 132 to the evaporator 134, and a vapor phase of the working fluid 148 can pass through a top portion of the interior volume of the condensate/vapor line 136, the top portion extending from the condenser 134 to the evaporator 132.

FIGS. 2A-2B illustrate a thermosiphon system 130 with multiple evaporators 132; each evaporator 132 can contact a different electronic device 124, or multiple evaporators 132 could contact the same electronic device, e.g., if the electronic device is particularly large or has multiple heat generating regions. The multiple evaporators 132 can be connected by the condensate/vapor lines 136 to the condenser 134 in series, e.g., a first condensate/vapor line connects the condenser 134 to a first evaporator 132, and a second condensate/vapor line 136 connects the first evaporator 132 to a second evaporator 132. Alternatively, some or all of the multiple evaporators 132 can be connected by the condensate/vapor lines 136 to the condenser 134 in parallel, e.g., a first condensate/vapor line connects the condenser to a first evaporator, and a second condensate/vapor line connects the condenser 134 to a second evaporator. Advantages of a serial implementation may be fewer tubes, whereas an advantage of parallel tubes is that the tube diameters can be smaller.

FIGS. 2A-2B illustrate a thermosiphon system 130 in which a common line is used for both the condensate flow from the condenser 134 to the evaporator 132 and for vapor flow from the evaporator 132 to the condenser 134. Thus, in this implementation the fluid coupling between the evaporator 132 and the condenser 134 consists of the combined condensate and vapor transfer line 136. In some implementations, there can be separate lines for the vapor and the condensate. However, a potential advantage of the combined condensate and vapor transfer line is that the line can be connected to a side of the condenser, reducing the vertical height of the system relative to a system with a separate line for the vapor, since the vapor line is typically coupled to or near the top of the evaporator. The condensate/vapor line 136 can be a flexible tube or pipe, e.g., of copper or aluminum.

As shown in FIGS. 2A-2B, a controller 144 (or control system) is communicably coupled to one or more temperature sensors 146, one or more pressure/liquid level sensors 150 located in the evaporator 132, an actuator 142 mounted between the condenser 134 and a base 140 (which, in some aspects, can be removed and the actuator 142 can be mounted to the frame 120), as well as fans 126 (e.g., to control a speed or state of the fans 126). Generally, the controller 144 may receive one or more inputs from the sensors 146 and/or sensors 150 (as well as other inputs) and control the actuator 142 to adjust a position of the condenser 134 to, for example, better match a cooling capacity of the thermosiphon system 130 with a heat load of the electronic devices 124.

In some aspects, inputs into the controller 144, such as the sensors 146 and/or sensors 150 may be indicative of the heat load of the electronic devices 124. For example, the sensors 146 may measure a temperature of the electronic devices 124 and/or the motherboard 122. Also, sensors 150 may measure a temperature, pressure, and/or liquid level of the working fluid 148 in the evaporator 132. Although not specifically shown, temperature, pressure, and/or level of the working fluid 148 may be measured in the condenser 134 or conduit 136 as indicative of the heat load of the electronic devices 124.

One or more operational parameters of the electronic devices 124 may also be measured by sensors (not shown) that may be indicative of the heat load of the electronic devices 124. For example, power usage (e.g., current, voltage, or power) of the electronic devices 124 may be measured and may be indicative of the heat load of the electronic devices 124. As another example, operational speed or frequency (e.g., Hz) of the electronic devices 124 may be measured and may be indicative of the heat load of the electronic devices 124. As another example, utilization (e.g., number of jobs executed or to be executed, or otherwise) of the electronic devices 124 may be measured and may be indicative of the heat load of the electronic devices 124. Such parameters may also be provided to the controller 144 and used to adjust the actuator 142.

The actuator 142 may be adjusted by the controller 144 based, at least in part on the measured or sensed parameters described above. In some implementations, the actuator 142 may adjust a height of the condenser 134 above the frame 120, which may also adjust a relative vertical distance between the condenser 134 and the evaporator 132. In some examples, as the relative vertical distance between the condenser 134 and the evaporator 132 increases, more liquid working fluid 148 flows to the evaporator 132, thereby increasing a cooling capacity of the thermosiphon system (e.g., allowing a liquid level of the working fluid 148 to increase in the evaporator 132). As the relative vertical distance between the condenser 134 and the evaporator 132 decreases, less liquid working fluid 148 flows to the evaporator 132, thereby decreasing a cooling capacity of the thermosiphon system (e.g., allowing a liquid level of the working fluid 148 to decrease in the evaporator 132). Although the cooling capacity of the thermosiphon system may be decreased, the cooling efficiency is increased by, for instance, preventing or reducing a back-up of liquid working fluid 148 in the evaporator 132.

By adjusting the relative vertical distance between the evaporator 132 and the condenser 134 (thereby adjusting a liquid level of working fluid 148 in the evaporator 132), the cooling capacity of the thermosiphon system 130 may more closely match the heat load of the electronic devices 124 (e.g., indicated by the one or more sensed or measure parameters described above). By matching or closely matching the heat load, the thermosiphon system 130 may operate more efficiently, for example, operate closer to a dryout condition where all or most of the liquid working fluid 148 in the evaporator 132 is vaporized by the heat of the electronic devices 124.

In some implementations, the actuator 142 may adjust an angular position of the condenser 134 relative to the frame 120, for example, by rotating and/or pivoting the condenser 134. In some examples, as the condenser 134 is rotated or pivoted, more liquid working fluid 148 may flow to the evaporator 132, thereby increasing a cooling capacity of the thermosiphon system (e.g., allowing a liquid level of the working fluid 148 to increase in the evaporator 132). For example, by rotating the condenser 134 relative to the evaporator 132, the pressure stackup may be changed. Further, in some aspects, the condenser 134 may be rotated as well as height-adjusted to adjust an amount of liquid working fluid 148 that flows from the condenser 134 to the evaporator 132. In some aspects, rotation of the condenser 134 may be preferred to adjusting the height of the condenser 134 because, for instance, the vertical height adjustment may be constrained by certain degrees of freedom (e.g., due to space allowances in a rack or on a server tray sub-assembly). As described above, by adjusting a liquid level of working fluid 148 in the evaporator 132, the cooling capacity of the thermosiphon system 130 may more closely match the heat load of the electronic devices 124 (e.g., indicated by the one or more sensed or measure parameters described above).

In some implementations, the actuator 142 may adjust a vibratory state of the condenser (in addition to or alternatively with adjusting a height or angular position). For example, based on a command from the controller 144, the actuator 142 may vibrate the condenser 134 in order to, for instance, minimize a size of bubbles in the working fluid 148 enclosed within the condenser 134. By minimizing a size of the bubbles of the working fluid 148 (e.g., breaking up larger bubbles into smaller bubbles), a thermal resistance of the working fluid 148 is decreased in the condenser 134 (e.g., to condensing) and/or evaporator (e.g., to boiling). As the thermal resistance to boiling/condensing is decreased, a heat transfer coefficient of the working fluid 148 is increased, thereby increasing a cooling capacity of the thermosiphon system 130. Thus, vibration of the condenser 134 by the actuator 142 (or of the evaporator 132 in alternative implementations) may adjust a cooling capacity of the thermosiphon system 130 to match or more closely match a heat load of the electronic devices 124.

In some implementations of the illustrated thermosiphon system 130, the actuator 142 is a mechanical or electro-mechanical device (e.g., piston-cylinder, motor, or otherwise) that receives commands from the controller 144 to adjust the condenser 134 as described above. In another implementation, the controller 144/actuator 142 combination may be implemented as a bimetallic strip or member 142 that is contactingly engaged with the condenser 134 (or conduit 136) and the evaporator 132 (or the electronic devices 124, motherboard 122 or frame 120). Based on a temperature difference between the components contacted by the bimetallic member 142, the member 142 may contract or expand to change the height difference between the condenser 134 and the evaporator 132 to adjust a cooling capacity of the thermosiphon system 130 as described above. In this implementation, no external power and/or sensors (e.g., input to the controller 144) may be necessary for operation of the adjustable thermosiphon system 130, thereby decreasing complexity of the system 130.

In other example implementations, the controller 144/actuator 142 combination may be implemented as a phase change motor or phase change linear actuator (e.g., wax motor) that is contactingly engaged with the condenser 134 and the frame 120. Based on a temperature difference between the components contacted by the phase change motor (e.g., the condenser 134 and the frame 120), the phase change motor may adjust the height difference between the condenser 134 and the evaporator 132 to adjust a cooling capacity of the thermosiphon system 130 as described above. As with the bimetallic strip implementation, no external power and/or sensors (e.g., input to the controller 144) may be necessary for operation of the adjustable thermosiphon system 130 with a phase change motor, thereby decreasing complexity of the system 130.

Figure 3A:
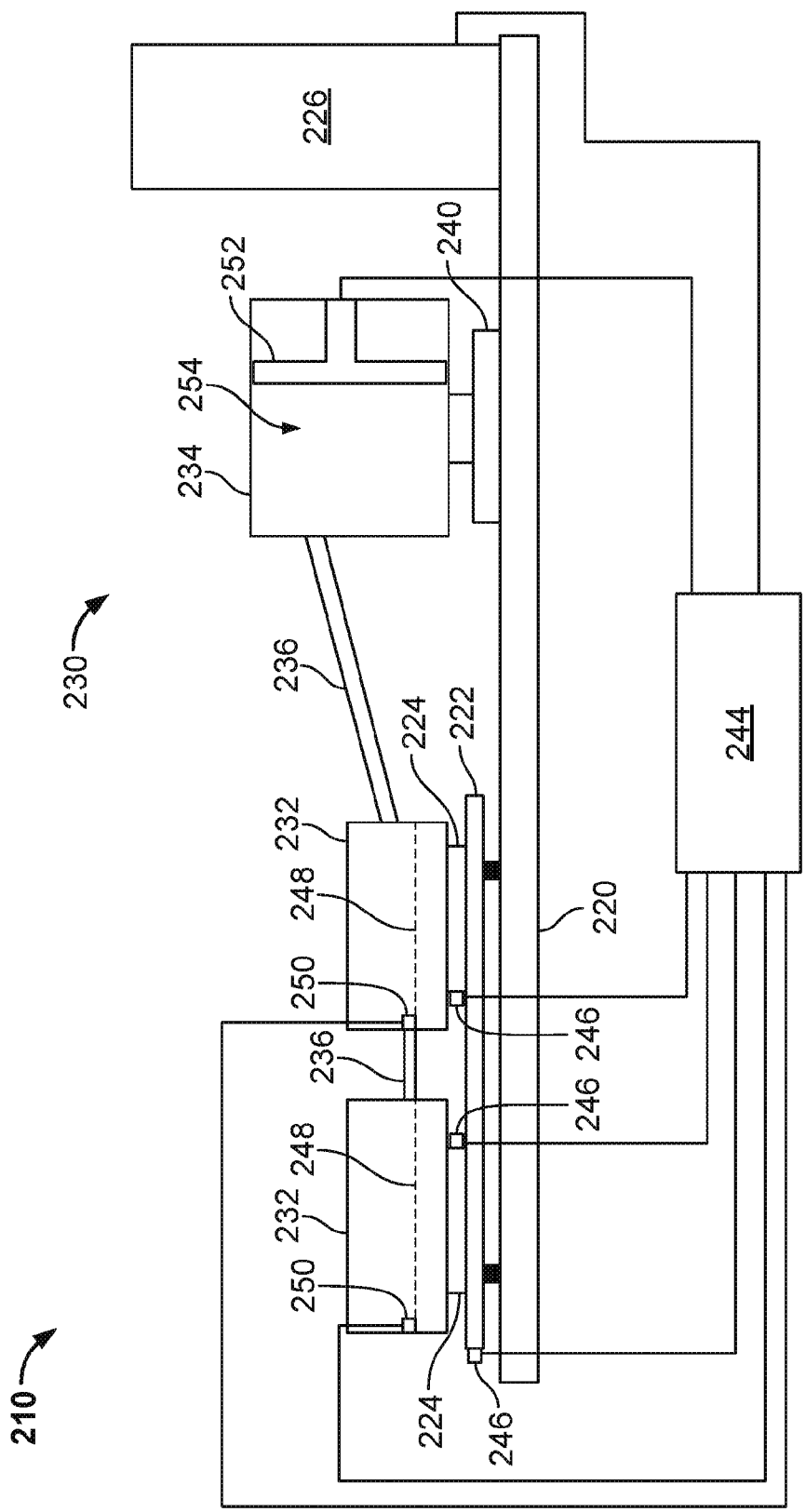
FIGS. 3A-3B illustrate schematic side and top views, respectively, of a server rack sub-assembly that includes another example implementation of a thermosiphon cooling system.
Figure 3B:
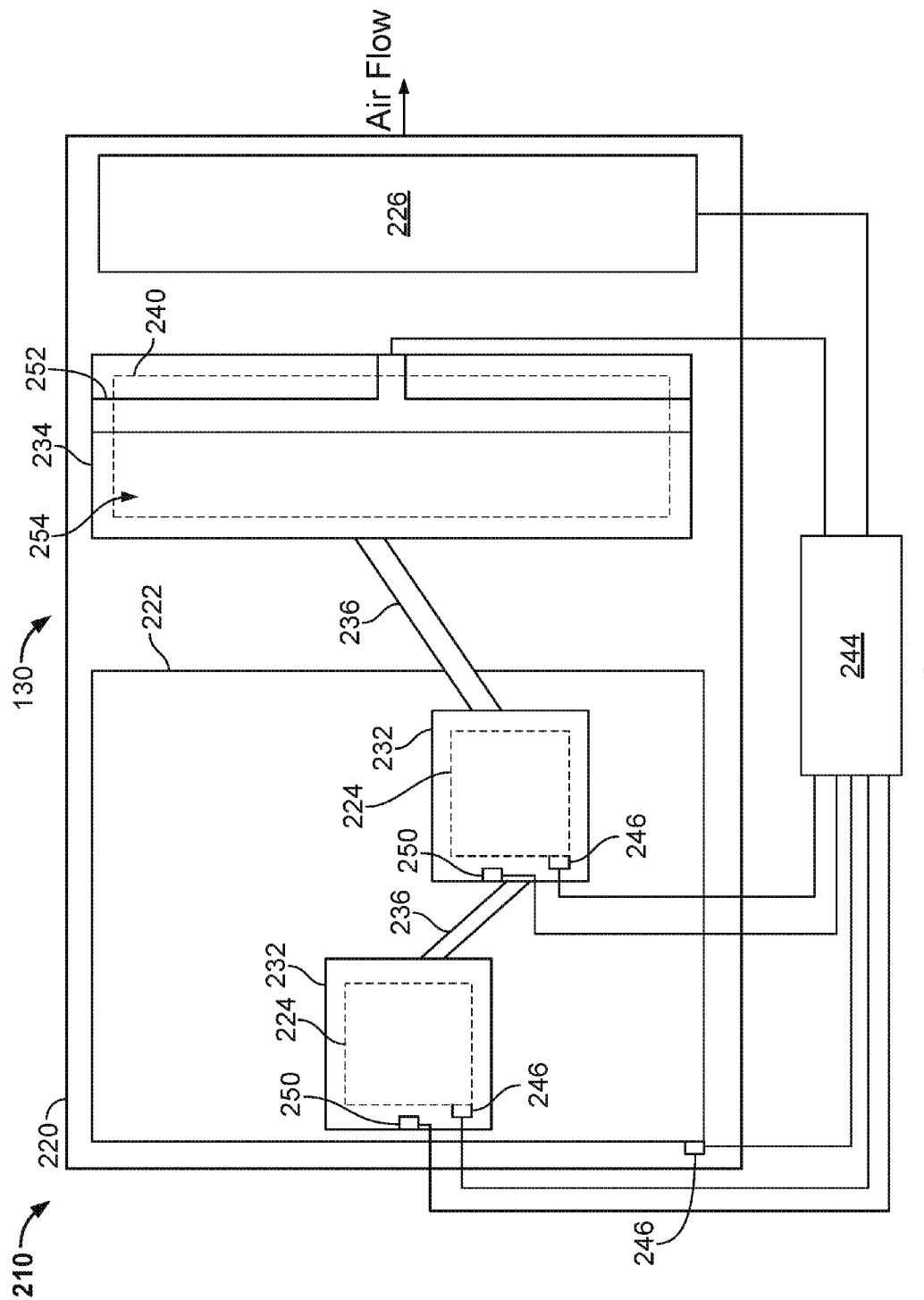

FIGS. 3A-3B illustrate schematic side and top views, respectively, of a server rack sub-assembly 210 that includes another example implementation of a thermosiphon cooling system 230. The server rack sub-assembly 210 includes a frame or cage 220, a printed circuit board 222, e.g., motherboard, supported on the frame 220, one or more heat-generating electronic devices 224, e.g., a processor or memory, mounted on the printed circuit board 222, and a thermosiphon system 230. One or more fans 226 can also be mounted on the frame 220.

The frame 220 can include or simply be a flat structure onto which the motherboard 222 can be placed and mounted, so that the frame 220 can be grasped by technicians for moving the motherboard into place and holding it in position within the rack 105. For example, the server rack sub-assembly 210 may be mounted horizontally in the server rack 105 such as by sliding the frame 220 into the slot 107 and over a pair of rails in the rack 105 on opposed sides of the server rack sub-assembly 210—much like sliding a lunch tray into a cafeteria rack. Although FIGS. 3A-3B illustrate the frame 220 extending below the motherboard 222, the frame can have other forms (e.g., by implementing it as a peripheral frame around the motherboard) or may be eliminated so that the motherboard itself is located in, e.g., slidably engages, the rack 105. In addition, although FIG. 3A illustrates the frame 220 as a flat plate, the frame 220 can include one or more side walls that project upwardly from the edges of the flat plate, and the flat plate could be the floor of a closed-top or open-top box or cage.

The illustrated server rack sub-assembly 210 includes a printed circuit board 222, e.g., a motherboard, on which a variety of components are mounted, including heat-generating electronic devices 224. Although one motherboard 222 is illustrated as mounted on the frame 220, multiple motherboards may be mounted on the frame 220, depending on the needs of the particular application. In some implementations, the one or more fans 226 can be placed on the frame 220 so that air enters at the front edge (at the left hand side in FIGS. 3A-3B) of the server rack sub-assembly 210, closer to the front of the rack 105 when the sub-assembly 210 is installed in the rack 105, flows (as illustrated) over the motherboard 222, over some of the heat generating components on the motherboard 222, and is exhausted from the server rack assembly 210 at the back edge (at the right hand side), closer to the back of the rack 105 when the sub-assembly 210 is installed in the rack 105. The one or more fans 226 can be secured to the frame 220 by brackets. Thus, the fans 226 can pull air from within the frame 220 area and push the air after it has been warmed out the rack 105. An underside of the motherboard 222 can be separated from the frame 220 by a gap.

The thermosiphon system 230 includes an evaporator 232, a condenser 234, and condensate/vapor lines 236 connecting the evaporator 232 to the condenser 234. The evaporator 232 contacts the electronic device 224 so that heat is drawn by conductive heat transfer from the electronic device 224 to the evaporator 232. For example, the evaporator 232 is in conductive thermal contact with the electronic device 224. In particular, the bottom of the evaporator 232 contacts the top of the electronic device 224. In operation, heat from the electronic device 224 causes a working fluid 248 in the evaporator 232 to evaporate. The vapor then passes through condensate/vapor lines 236 to the condenser 234. Heat is radiated away from the condenser 234, e.g., into air around the condenser 234 or into air blown or drawn by the one or more fans 226 that passes across the condenser 234, causing the working fluid 248 to condense. As shown in FIG. 3A, the condenser 234 can be located between the one or more fans 226 from the evaporator 232, but could also be located on an opposite side of one or more of fans 226 (e.g., near an edge of the sub-assembly 210).

As shown in FIG. 3A, the condensate/vapor line 236 is at a slight (non-zero) angle so that gravity causes the condensed working fluid 248 to flow back through the condensate/vapor lines 236 to the evaporator 232. Thus, in some implementations, at least a portion of the condensate/vapor line 236 is not parallel to the main surface of the frame 220. For example, the condenser-side end of the condensate/vapor line 236 can be about 1-5 mm, e.g., 2 mm, above the evaporator-side end of the condensate/vapor line 236. However, it is also possible for the condensate/vapor line 236 to be horizontal tube, or even at a slightly negative angle (although the positive angle provides an advantage of gravity improving flow of the liquid from the condenser to the evaporator). Because there can be multiple heat generating electronic devices on a single motherboard, there can be multiple evaporators on the motherboard, where each evaporator corresponds to a single electronic device. As shown in FIG. 3A, there is a first evaporator 232 and a second evaporator 232 as well as a first electronic device 224 and a second electronic device 224. The condensate/vapor line 236 connecting the first evaporator to the second evaporator can be level.

During operation, the top surface of the working fluid 248 (as a liquid) inside the condenser 234 will be above the top surface liquid height of the working fluid 248 in the evaporator 232, e.g., by 1 to 10 mm. It can be easier to achieve this with a condensate/vapor line 236 that is at a slight (positive non-zero) angle, but proper selection of the thermal and mechanical properties of the working fluid 248 in view of the expected heat transport requirements for the thermosiphon system 230 may still achieve this for a condensate/vapor line 236 that is horizontal or at a slightly negative angle. During operation, the liquid phase of a working fluid 248 can fill a bottom portion of an interior volume of the condensate/vapor line 236, with the bottom portion extending from the condenser 234 to the evaporator 232, and a vapor phase of the working fluid 248 can pass through a top portion of the interior volume of the condensate/vapor line 236, with the top portion extending from the condenser 234 to the evaporator 232.

In some implementations, the condenser 234 can be located at a height above the evaporator 232 such that a liquid phase of the working fluid 248 fills a bottom portion of an interior volume of the condensate/vapor line 236 and such that during operation a top surface of the liquid phase has at a non-zero angle relative to horizontal from the condenser 232 to the evaporator 234, and a vapor phase of the working fluid 248 can pass through a top portion of the interior volume of the condensate/vapor line 236, the top portion extending from the condenser 234 to the evaporator 232.

FIGS. 3A-3B illustrate a thermosiphon system 230 with multiple evaporators 232; each evaporator 232 can contact a different electronic device 224, or multiple evaporators 232 could contact the same electronic device, e.g., if the electronic device is particularly large or has multiple heat generating regions. The multiple evaporators 232 can be connected by the condensate/vapor lines 236 to the condenser 234 in series, e.g., a first condensate/vapor line connects the condenser 234 to a first evaporator 232, and a second condensate/vapor line 236 connects the first evaporator 232 to a second evaporator 232. Alternatively, some or all of the multiple evaporators 232 can be connected by the condensate/vapor lines 236 to the condenser 234 in parallel, e.g., a first condensate/vapor line connects the condenser to a first evaporator, and a second condensate/vapor line connects the condenser 234 to a second evaporator. Advantages of a serial implementation may be fewer tubes, whereas an advantage of parallel tubes is that the tube diameters can be smaller.

FIGS. 3A-3B illustrate a thermosiphon system 230 in which a common line is used for both the condensate flow from the condenser 234 to the evaporator 232 and for vapor flow from the evaporator 232 to the condenser 234. Thus, in this implementation the fluid coupling between the evaporator 232 and the condenser 234 consists of the combined condensate and vapor transfer line 236. In some implementations, there can be separate lines for the vapor and the condensate. However, a potential advantage of the combined condensate and vapor transfer line is that the line can be connected to a side of the condenser, reducing the vertical height of the system relative to a system with a separate line for the vapor, since the vapor line is typically coupled to or near the top of the evaporator. The condensate/vapor line 236 can be a flexible tube or pipe, e.g., of copper or aluminum.

As shown in FIGS. 3A-3B, a controller 244 (or control system) is communicably coupled to one or more temperature sensors 246, one or more pressure/liquid level sensors 250 located in the evaporator 232, and a piston 252 mounted within a working volume 254 of the condenser 234, as well as the one or more fans 226 (e.g., to control a speed or state of the fans 226). Generally, the controller 244 may receive one or more inputs from the sensors 246 and/or sensors 250 (as well as other inputs) and control the piston 252 to adjust the working volume 254 of the condenser 234 to, for example, better match a cooling capacity of the thermosiphon system 230 with a heat load of the electronic devices 224.

In some aspects, inputs into the controller 244, such as the sensors 246 and/or sensors 250 may be indicative of the heat load of the electronic devices 224. For example, the sensors 246 may measure a temperature of the electronic devices 224 and/or the motherboard 222. Also, sensors 250 may measure a temperature, pressure, and/or liquid level of the working fluid 248 in the evaporator 232. Although not specifically shown, temperature, pressure, and/or level of the working fluid 248 may be measured in the condenser 234 or conduit 236 as indicative of the heat load of the electronic devices 224.

One or more operational parameters of the electronic devices 224 may also be measured by sensors (not shown) that may be indicative of the heat load of the electronic devices 224. For example, power usage (e.g., current, voltage, or power) of the electronic devices 224 may be measured and may be indicative of the heat load of the electronic devices 224. As another example, operational speed or frequency (e.g., Hz) of the electronic devices 224 may be measured and may be indicative of the heat load of the electronic devices 224. As another example, utilization (e.g., number of jobs executed or to be executed, or otherwise) of the electronic devices 224 may be measured and may be indicative of the heat load of the electronic devices 224. Such parameters may also be provided to the controller 244 and used to adjust the piston 252.

The piston 252 may be adjusted (e.g., into and out of the condenser 232) by the controller 144 based, at least in part on the measured or sensed parameters described above. In some implementations, the piston 252 may adjust the working volume 254 of the condenser 234. In some examples, as the working volume 254 of the condenser 234 is decreased, a saturation pressure/temperature of the working fluid 248 in the condenser 234 is increased, thereby increasing a cooling capacity of the thermosiphon system 230 (e.g., allowing a liquid level of the working fluid 248 to increase in the evaporator 232). As the working volume 254 of the condenser 234 is increased, the saturation pressure/temperature of the working fluid 248 in the condenser 234 is decreased to decrease the liquid working fluid 248 in the evaporator 232, thereby decreasing a cooling capacity of the thermosiphon system 230.

By adjusting the working volume 254 of the condenser 234 (thereby adjusting a liquid level of working fluid 248 in the evaporator 232), the cooling capacity of the thermosiphon system 230 may more closely match the heat load of the electronic devices 224 (e.g., indicated by the one or more sensed or measure parameters described above). By matching or closely matching the heat load, the thermosiphon system 230 may operate more efficiently, for example, operate closer to a dryout condition where all or most of the liquid working fluid 248 in the evaporator 232 is vaporized by the heat of the electronic devices 224.

In some implementations, the piston 252 may adjust a vibratory state of the condenser 234 (in addition to or alternatively with adjusting the working volume 254). For example, based on a command from the controller 244, the piston 252 may vibrate the condenser 234 in order to, for instance, minimize a size of bubbles in the working fluid 248 enclosed within the condenser 234. By minimizing a size of the bubbles of the working fluid 248 (e.g., breaking up larger bubbles into smaller bubbles), a thermal resistance of the working fluid 248 is decreased in the condenser 234 (e.g., to condensing) and/or evaporator 232 (e.g., to boiling). As the thermal resistance to boiling/condensing is decreased, a heat transfer coefficient of the working fluid 248 is increased, thereby increasing a cooling capacity of the thermosiphon system 230. Thus, vibration of the condenser 234 by the piston 252 (or of the evaporator 232 in alternative implementations) may increase a cooling capacity of the thermosiphon system 230 to match or more closely match a heat load of the electronic devices 224.

In some implementations of the illustrated thermosiphon system 230, the piston 252 is actuated by a mechanical or electro-mechanical device (e.g., piston-cylinder, motor, or otherwise) that receives commands from the controller 244 to adjust the condenser 234 as described above. In another implementation, the controller 244 may be implemented as a bimetallic member or phase change motor that is contactingly engaged with the piston 252. Based on a temperature difference between the components contacted by the bimetallic member/phase change motor, the member/motor may adjust a position of the piston 252 in the working volume 254 of the condenser 234. In this implementation, no external power and/or sensors (e.g., input to the controller 244) may be necessary for operation of the adjustable thermosiphon system 230, thereby decreasing complexity of the system 230.

Figure 4A:
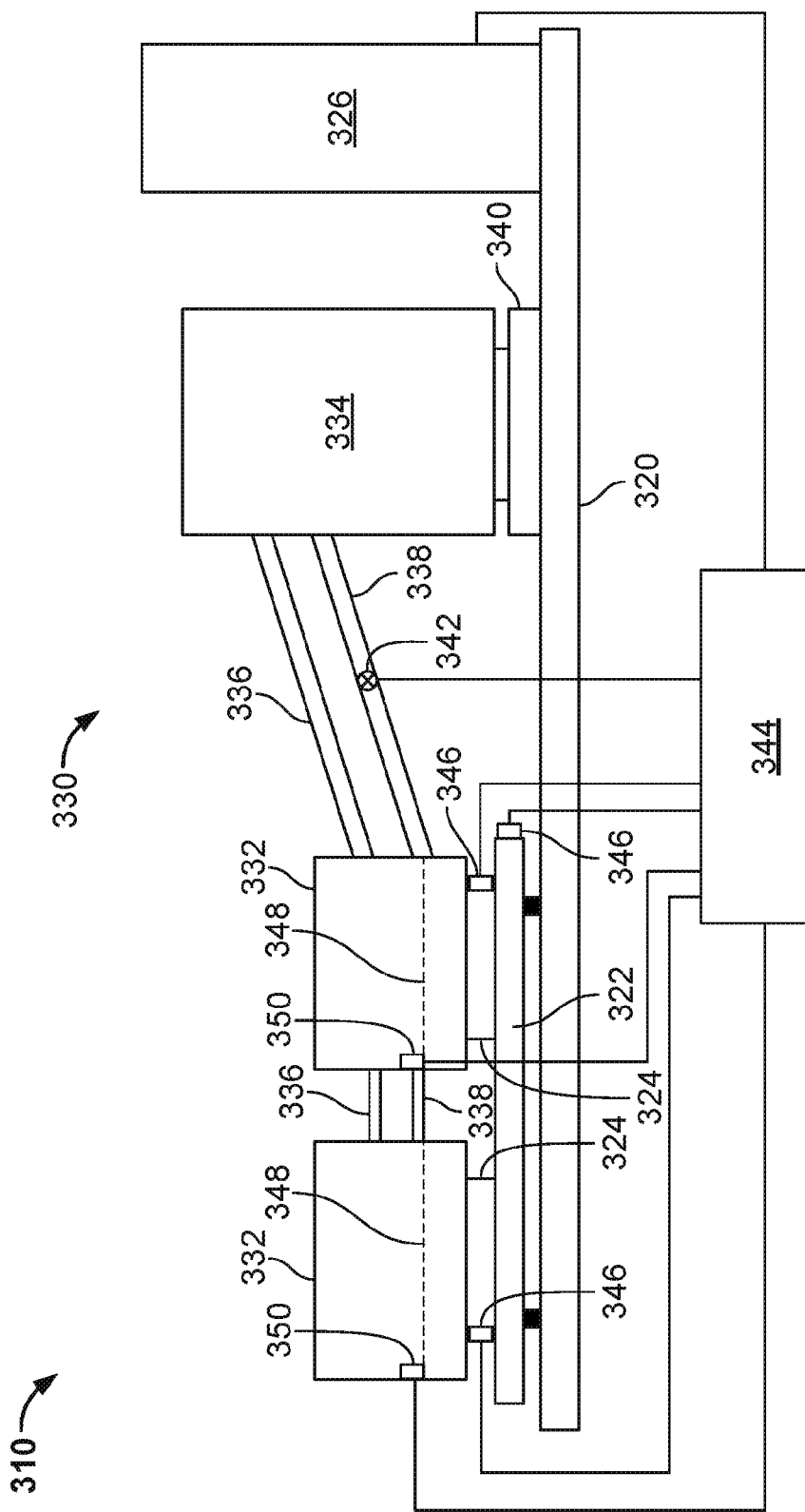
FIGS. 4A-4B illustrate schematic side and top views, respectively, of a server rack sub-assembly that includes another example implementation of a thermosiphon cooling system.
Figure 4B:
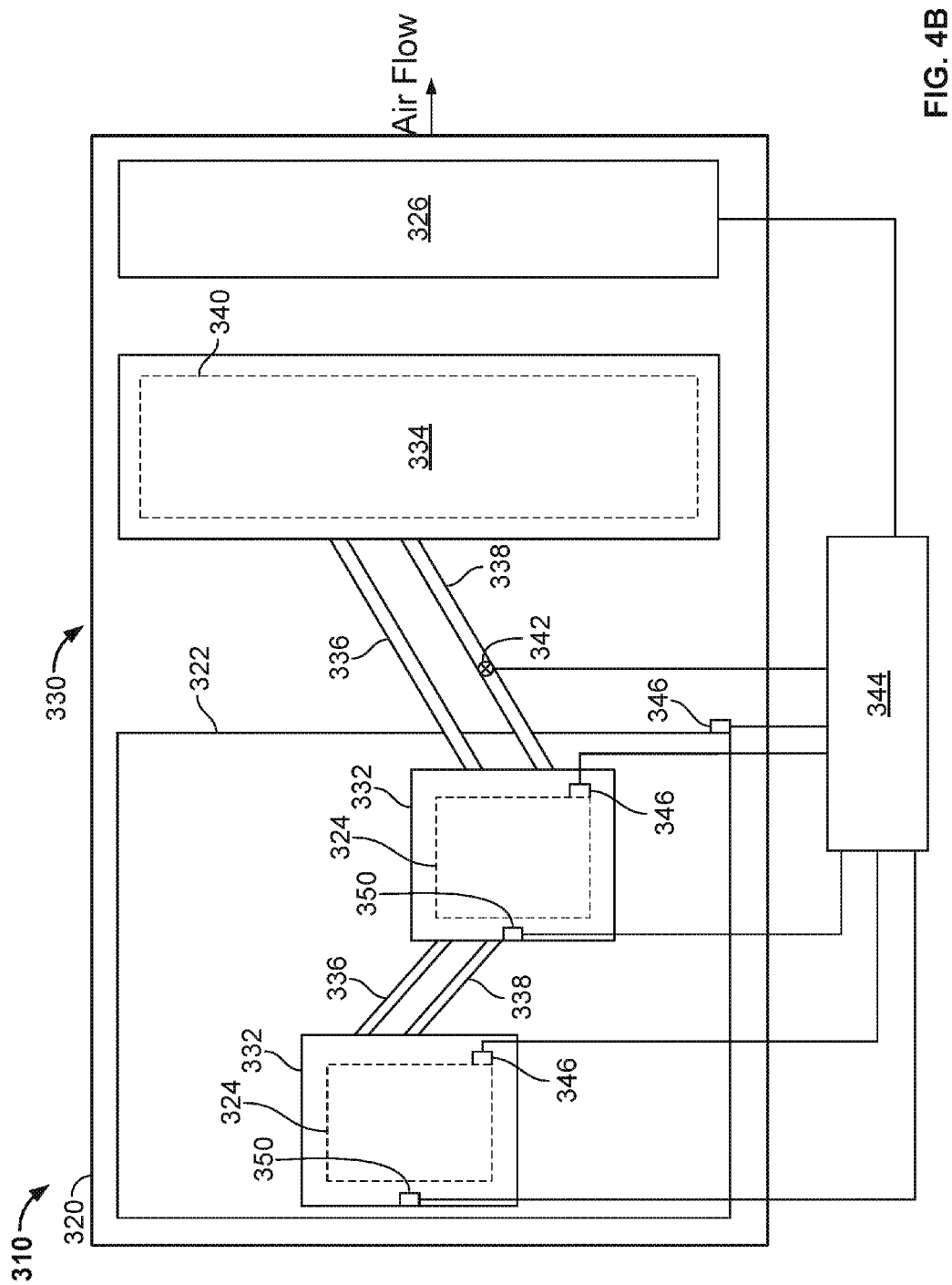

FIGS. 4A-4B illustrate schematic side and top views, respectively, of a server rack sub-assembly 310 that includes another example implementation of a thermosiphon cooling system 330. The server rack sub-assembly 310 includes a frame or cage 320, a printed circuit board 322, e.g., motherboard, supported on the frame 320, one or more heat-generating electronic devices 324, e.g., a processor or memory, mounted on the printed circuit board 322, and a thermosiphon system 330. One or more fans 326 can also be mounted on the frame 320.

The frame 320 can include or simply be a flat structure onto which the motherboard 322 can be placed and mounted, so that the frame 320 can be grasped by technicians for moving the motherboard into place and holding it in position within the rack 105. For example, the server rack sub-assembly 310 may be mounted horizontally in the server rack 105 such as by sliding the frame 320 into the slot 107 and over a pair of rails in the rack 105 on opposed sides of the server rack sub-assembly 310—much like sliding a lunch tray into a cafeteria rack. Although FIGS. 4A-4B illustrate the frame 320 extending below the motherboard 322, the frame can have other forms (e.g., by implementing it as a peripheral frame around the motherboard) or may be eliminated so that the motherboard itself is located in, e.g., slidably engages, the rack 105. In addition, although FIG. 4A illustrates the frame 320 as a flat plate, the frame 320 can include one or more side walls that project upwardly from the edges of the flat plate, and the flat plate could be the floor of a closed-top or open-top box or cage.

The illustrated server rack sub-assembly 310 includes a printed circuit board 322, e.g., a motherboard, on which a variety of components are mounted, including heat-generating electronic devices 324. Although one motherboard 322 is illustrated as mounted on the frame 320, multiple motherboards may be mounted on the frame 320, depending on the needs of the particular application. In some implementations, the one or more fans 326 can be placed on the frame 320 so that air enters at the front edge (at the left hand side in FIGS. 4A-4B) of the server rack sub-assembly 310, closer to the front of the rack 105 when the sub-assembly 310 is installed in the rack 105, flows (as illustrated) over the motherboard 322, over some of the heat generating components on the motherboard 322, and is exhausted from the server rack assembly 310 at the back edge (at the right hand side), closer to the back of the rack 105 when the sub-assembly 310 is installed in the rack 105. The one or more fans 326 can be secured to the frame 320 by brackets. Thus, the fans 326 can pull air from within the frame 320 area and push the air after it has been warmed out the rack 105. An underside of the motherboard 322 can be separated from the frame 320 by a gap.

The thermosiphon system 330 includes an evaporator 332, a condenser 334, and a condensate line 338 and a vapor line 336 that connect the evaporator 332 to the condenser 334. Thus, in this implementation, there are separate conduits to transport liquid working fluid 348 from the condenser 334 to the evaporator 332, and vapor working fluid 348 from the evaporator 332 to the condenser 334. One or both of the lines 338 and 336 may be a flexible conduit, or may be a rigid conduit (e.g., copper or aluminum).

The evaporator 332 contacts the electronic device 324 so that heat is drawn by conductive heat transfer from the electronic device 324 to the evaporator 332. For example, the evaporator 332 is in conductive thermal contact with the electronic device 324. In particular, the bottom of the evaporator 332 contacts the top of the electronic device 324. In operation, heat from the electronic device 324 causes a working fluid 348 in the evaporator 332 to evaporate. The vapor then passes through the vapor line 336 to the condenser 334. Heat is radiated away from the condenser 334, e.g., into air around the condenser 334 or into air blown or drawn by the one or more fans 326 that passes across the condenser 334, causing the working fluid 348 to condense. As shown in FIG. 4A, the condenser 334 can be located between the one or more fans 326 from the evaporator 332, but could also be located on an opposite side of one or more of fans 326 (e.g., near an edge of the sub-assembly 310).

As shown in FIG. 4A, the vapor/condensate lines 336/338 are at a slight (non-zero) angle so that gravity causes the condensed working fluid 348 to flow back through the condensate line 338 to the evaporator 332. Thus, in some implementations, at least a portion of each of the vapor/condensate lines 336/338 is not parallel to the main surface of the frame 320. For example, the condensate line 338 can be about 1-5 mm, e.g., 2 mm, above the vapor line 336. However, it is also possible for the vapor/condensate lines 336/338 to be horizontal tube, or even at a slightly negative angle (although the positive angle provides an advantage of gravity improving flow of the liquid from the condenser to the evaporator). Because there can be multiple heat generating electronic devices on a single motherboard, there can be multiple evaporators on the motherboard, where each evaporator corresponds to a single electronic device. As shown in FIG. 4A, there is a first evaporator 332 and a second evaporator 332 as well as a first electronic device 324 and a second electronic device 324. The vapor/condensate lines 336/338 connecting the first evaporator to the second evaporator can be level.

During operation, the top surface of the working fluid 348 (as a liquid) inside the condenser 334 will be above the top surface liquid height of the working fluid 348 in the evaporator 332, e.g., by 1 to 10 mm. It can be easier to achieve this with a condensate line 338 that is at a slight (positive non-zero) angle, but proper selection of the thermal and mechanical properties of the working fluid 348 in view of the expected heat transport requirements for the thermosiphon system 330 may still achieve this for a condensate line 338 that is horizontal or at a slightly negative angle.

FIGS. 4A-4B illustrate a thermosiphon system 330 with multiple evaporators 332; each evaporator 332 can contact a different electronic device 324, or multiple evaporators 332 could contact the same electronic device, e.g., if the electronic device is particularly large or has multiple heat generating regions. The multiple evaporators 332 can be connected by the vapor/condensate lines 336/338 to the condenser 334 in series, e.g., a first set of vapor/condensate lines 336/338 connect the condenser 334 to a first evaporator 332, and a second set of vapor/condensate lines 336/338 connect the first evaporator 332 to a second evaporator 332. Alternatively, some or all of the multiple evaporators 332 can be connected by the vapor/condensate lines 336/338 to the condenser 334 in parallel, e.g., a first set of vapor/condensate lines 336/338 connect the condenser to a first evaporator, and a second set of vapor/condensate lines 336/338 connect the condenser 334 to a second evaporator. Advantages of a serial implementation may be fewer tubes, whereas an advantage of parallel tubes is that the tube diameters can be smaller.

As shown in FIGS. 4A-4B, a controller 344 (or control system) is communicably coupled to one or more temperature sensors 346, one or more pressure/liquid level sensors 350 located in the evaporator 332, and a valve 342 mounted within the condensate line 338, as well as the one or more fans 326 (e.g., to control a speed or state of the fans 326). Generally, the controller 344 may receive one or more inputs from the sensors 346 and/or sensors 350 (as well as other inputs) and control the valve 342, based at least in part on one or more of such inputs (or other inputs), to adjust the valve 342 to control an amount of liquid working fluid 348 that flows to the evaporator 332 to, for example, better match a heat load of the electronic devices 324.

In alternative aspects, the valve 342 may be mounted in the vapor line 336, in both vapor/condensate lines 336/338, or in a portion of the thermosiphon system 330 that is fluidly coupled to one or both of the vapor/condensate lines 336/338. In short, the valve 342 may be positioned in any appropriate location to control the liquid level of the working fluid 348 in the evaporator 332.

In some aspects, inputs into the controller 344, such as the sensors 346 and/or sensors 350 may be indicative of the heat load of the electronic devices 324. For example, the sensors 346 may measure a temperature of the electronic devices 324 and/or the motherboard 322. Also, sensors 350 may measure a temperature, pressure, and/or liquid level of the working fluid 348 in the evaporator 332. Although not specifically shown, temperature, pressure, and/or level of the working fluid 348 may be measured in the condenser 334 or vapor/condensate lines 336/338 as indicative of the heat load of the electronic devices 324.

One or more operational parameters of the electronic devices 324 may also be measured by sensors (not shown) that may be indicative of the heat load of the electronic devices 324. For example, power usage (e.g., current, voltage, or power) of the electronic devices 324 may be measured and may be indicative of the heat load of the electronic devices 324. As another example, operational speed or frequency (e.g., Hz) of the electronic devices 324 may be measured and may be indicative of the heat load of the electronic devices 324. As another example, utilization (e.g., number of jobs executed or to be executed, or otherwise) of the electronic devices 324 may be measured and may be indicative of the heat load of the electronic devices 324. Such parameters may also be provided to the controller 344 and used to adjust the valve 342.

The valve 342 may be modulated (e.g. opened or closed) by the controller 344 based, at least in part on the measured or sensed parameters described above. In some implementations, by modulating the valve 342, a liquid level of the working fluid 348 in the evaporator 332 may be adjusted. By adjusting a liquid level of working fluid 348 in the evaporator 332, the cooling capacity of the thermosiphon system 330 may more closely match the heat load of the electronic devices 324 (e.g., indicated by the one or more sensed or measure parameters described above). By matching or closely matching the heat load, the thermosiphon system 330 may operate more efficiently, for example, operate closer to a dryout condition where all or most of the liquid working fluid 348 in the evaporator 332 is vaporized by the heat of the electronic devices 324.

Figure 5:
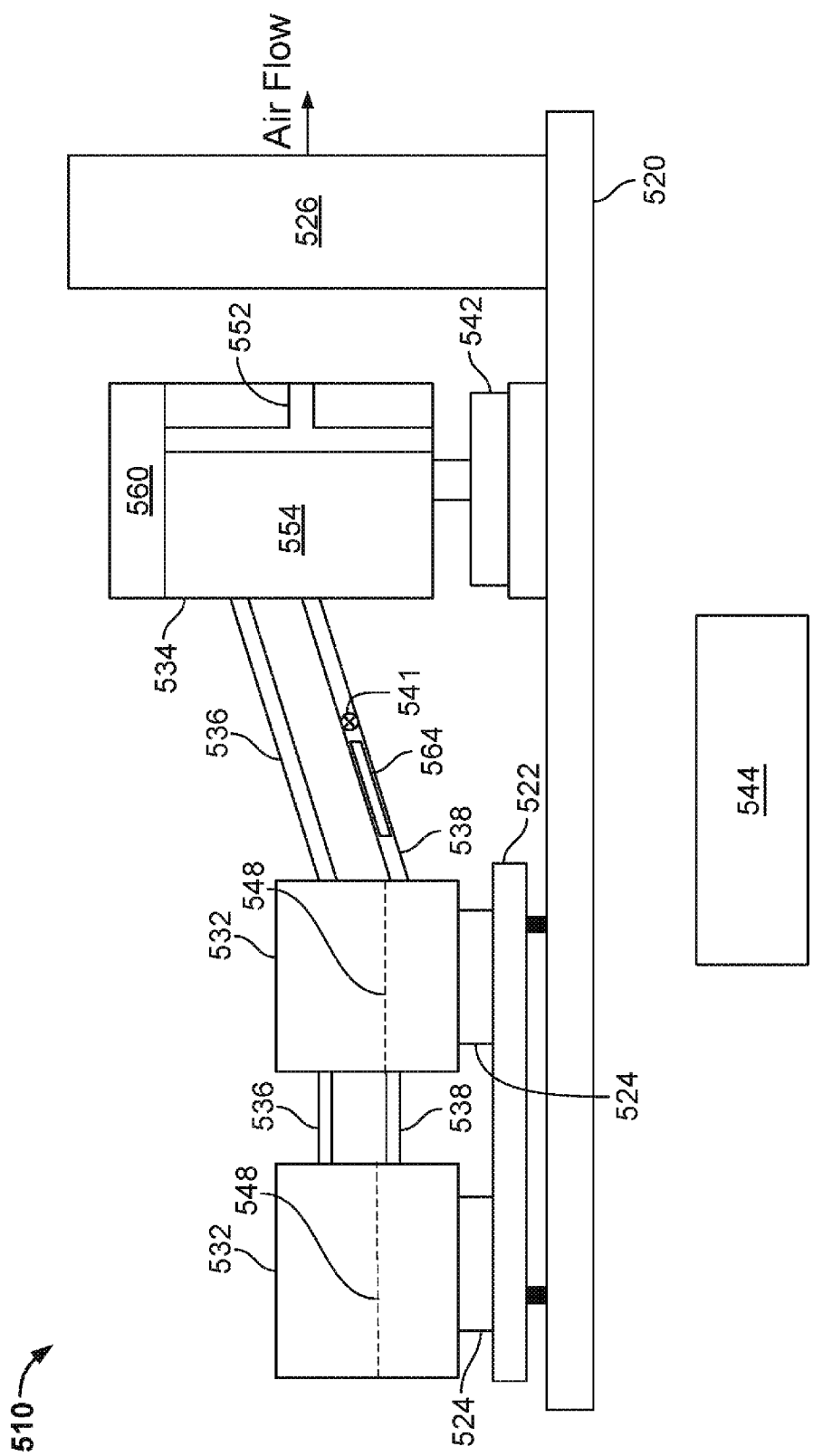
FIG. 5 illustrates a schematic side view of a server rack sub-assembly that includes another example implementation of a thermosiphon cooling system.

FIG. 5 illustrates a schematic side view of a server rack sub-assembly 510 that includes another example implementation of a thermosiphon cooling system 530. Thermosiphon system 530, as shown, may include one or more components of the previously-described thermosiphon systems 130, 230, and 330, as well as additional components. Each of the components may, based at least in part on one or more sensed or measured parameters that are indicative of a heat load and/or power usage of one or more heat-generating electronic devices 524, control a liquid level of a working fluid 548 in an evaporator 532 of the thermosiphon system 530. By controlling the liquid level of the working fluid 548, a cooling capacity of the thermosiphon system 530 may more closely match a heat load of the one or more heat-generating electronic devices 524, thereby allowing the thermosiphon system 530 to operate more efficiently (e.g., operate at or close to a dryout capacity) at many different heat loads of the one or more heat-generating electronic devices 524.

The server rack sub-assembly 510 includes a frame or cage 520, a printed circuit board 522, e.g., motherboard, supported on the frame 520, one or more heat-generating electronic devices 524, e.g., a processor or memory, mounted on the printed circuit board 522, and a thermosiphon system 530. One or more fans 526 can also be mounted on the frame 520 to circulate air over the condenser 534, which in the illustrated implementation, includes a heat transfer surface 560 (e.g., fins or other surface) mounted thereon.

The frame 520 can include or simply be a flat structure onto which the motherboard 522 can be placed and mounted, so that the frame 520 can be grasped by technicians for moving the motherboard into place and holding it in position within the rack 105. For example, the server rack sub-assembly 510 may be mounted horizontally in the server rack 105 such as by sliding the frame 520 into the slot 107 and over a pair of rails in the rack 105 on opposed sides of the server rack sub-assembly 510—much like sliding a lunch tray into a cafeteria rack. Although FIG. 5 illustrates the frame 520 extending below the motherboard 522, the frame can have other forms (e.g., by implementing it as a peripheral frame around the motherboard) or may be eliminated so that the motherboard itself is located in, e.g., slidably engages, the rack 105. In addition, although FIG. 5 illustrates the frame 520 as a flat plate, the frame 520 can include one or more side walls that project upwardly from the edges of the flat plate, and the flat plate could be the floor of a closed-top or open-top box or cage.

The illustrated server rack sub-assembly 510 includes a printed circuit board 522, e.g., a motherboard, on which a variety of components are mounted, including heat-generating electronic devices 524. Although one motherboard 522 is illustrated as mounted on the frame 520, multiple motherboards may be mounted on the frame 520, depending on the needs of the particular application. In some implementations, the one or more fans 526 can be placed on the frame 520 so that air enters at the front edge (at the left hand side in FIG. 5) of the server rack sub-assembly 510, closer to the front of the rack 105 when the sub-assembly 510 is installed in the rack 105, flows (as illustrated) over the motherboard 522, over some of the heat generating components on the motherboard 522, and is exhausted from the server rack assembly 510 at the back edge (at the right hand side), closer to the back of the rack 105 when the sub-assembly 510 is installed in the rack 105. The one or more fans 526 can be secured to the frame 520 by brackets. Thus, the fans 526 can pull air from within the frame 520 area and push the air after it has been warmed out the rack 105. An underside of the motherboard 522 can be separated from the frame 520 by a gap.

The thermosiphon system 530 includes the evaporator 532, a condenser 534, and a condensate line 538 and a vapor line 536 that connect the evaporator 532 to the condenser 534. Thus, in this implementation, there are separate conduits to transport liquid working fluid 548 from the condenser 534 to the evaporator 532, and vapor working fluid 548 from the evaporator 532 to the condenser 534. One or both of the lines 538 and 536 may be a flexible conduit, or may be a rigid conduit (e.g., copper or aluminum).

The evaporator 532 contacts the electronic device 524 so that heat is drawn by conductive heat transfer from the electronic device 524 to the evaporator 532. For example, the evaporator 532 is in conductive thermal contact with the electronic device 524. In particular, the bottom of the evaporator 532 contacts the top of the electronic device 524. In operation, heat from the electronic device 524 causes a working fluid 548 in the evaporator 532 to evaporate. The vapor then passes through the vapor line 536 to the condenser 534. Heat is radiated away from the condenser 534, e.g., into air around the condenser 534 or into air blown or drawn by the one or more fans 526 that passes across the condenser 534, causing the working fluid 548 to condense. As shown in FIG. 5, the condenser 534 can be located between the one or more fans 526 from the evaporator 532, but could also be located on an opposite side of one or more of fans 526 (e.g., near an edge of the sub-assembly 510).

As shown in FIG. 5, the vapor/condensate lines 536/538 are at a slight (non-zero) angle so that gravity causes the condensed working fluid 548 to flow back through the condensate line 538 to the evaporator 532. Thus, in some implementations, at least a portion of each of the vapor/condensate lines 536/538 is not parallel to the main surface of the frame 520. For example, the condensate line 538 can be about 1-5 mm, e.g., 2 mm, above the vapor line 536. However, it is also possible for the vapor/condensate lines 536/538 to be horizontal tube, or even at a slightly negative angle (although the positive angle provides an advantage of gravity improving flow of the liquid from the condenser to the evaporator). Because there can be multiple heat generating electronic devices on a single motherboard, there can be multiple evaporators on the motherboard, where each evaporator corresponds to a single electronic device. As shown in FIG. 5, there is a first evaporator 532 and a second evaporator 532 as well as a first electronic device 524 and a second electronic device 524. The vapor/condensate lines 536/538 connecting the first evaporator to the second evaporator can be level.

During operation, the top surface of the working fluid 548 (as a liquid) inside the condenser 534 will be above the top surface liquid height of the working fluid 548 in the evaporator 532, e.g., by 1 to 10 mm. It can be easier to achieve this with a condensate line 538 that is at a slight (positive non-zero) angle, but proper selection of the thermal and mechanical properties of the working fluid 548 in view of the expected heat transport requirements for the thermosiphon system 530 may still achieve this for a condensate line 538 that is horizontal or at a slightly negative angle.

FIG. 5 illustrates a thermosiphon system 530 with multiple evaporators 532; each evaporator 532 can contact a different electronic device 524, or multiple evaporators 532 could contact the same electronic device, e.g., if the electronic device is particularly large or has multiple heat generating regions. The multiple evaporators 532 can be connected by the vapor/condensate lines 536/538 to the condenser 534 in series, e.g., a first set of vapor/condensate lines 536/538 connect the condenser 534 to a first evaporator 532, and a second set of vapor/condensate lines 536/538 connect the first evaporator 532 to a second evaporator 532. Alternatively, some or all of the multiple evaporators 532 can be connected by the vapor/condensate lines 536/538 to the condenser 534 in parallel, e.g., a first set of vapor/condensate lines 536/538 connect the condenser to a first evaporator, and a second set of vapor/condensate lines 536/538 connect the condenser 534 to a second evaporator. Advantages of a serial implementation may be fewer tubes, whereas an advantage of parallel tubes is that the tube diameters can be smaller.

The thermosiphon system 530 may include one or more components that, based at least in part on one or more sensed or measured parameters that are indicative of a heat load and/or power usage of the heat-generating electronic devices 524, control a liquid level of the working fluid 548 in the evaporator 532 of the thermosiphon system 530.

For example, thermosiphon system 530 may include an actuator 542. Actuator 542 may be similar to the actuator 142 described above. For instance, the actuator 542 may be adjusted by a controller of the thermosiphon system 530 to adjust a height of the condenser 534 above the frame 520, which may also adjust a relative vertical distance between the condenser 534 and the evaporator 532. As the relative vertical distance between the condenser 534 and the evaporator 532 increases, more liquid working fluid 548 flows to the evaporator 532, thereby increasing a cooling capacity of the thermosiphon system 530 (e.g., allowing a liquid level of the working fluid 548 to increase in the evaporator 532). The actuator 542 may also adjust an angular position of the condenser 534 relative to the frame 520, for example, by rotating and/or pivoting the condenser 534. In some examples, as the condenser 534 is rotated or pivoted, more liquid working fluid 548 may flow to the evaporator 532, thereby increasing a cooling capacity of the thermosiphon system 530 (e.g., allowing a liquid level of the working fluid 548 to increase in the evaporator 532). In some implementations, the actuator 542 may also adjust a vibratory state of the condenser 534 (in addition to or alternatively with adjusting a height or angular position). The actuator 542 may vibrate the condenser 534 in order to, for instance, minimize a size of bubbles in the working fluid 548 enclosed within the condenser 534. By minimizing a size of the bubbles of the working fluid 548 (e.g., breaking up larger bubbles into smaller bubbles), a thermal resistance of the working fluid 548 is decreased in the condenser 534 (e.g., to condensing) and/or evaporator (e.g., to boiling). As the thermal resistance to boiling/condensing is decreased, a heat transfer coefficient of the working fluid 548 is increased, thereby increasing a cooling capacity of the thermosiphon system 530. Thus, vibration of the condenser 534 by the actuator 542 (or of the evaporator 532 in alternative implementations) may increase a cooling capacity of the thermosiphon system 530 to match or more closely match a heat load of the electronic devices 524.

The thermosiphon system 530 may include a piston 552. The piston 552 may be similar to the piston 252 shown in FIGS. 3A-3B. For example, the piston 552 may adjust a working volume 554 of the condenser 534. In some examples, as the working volume 554 of the condenser 534 is decreased, a saturation pressure/temperature of the working fluid 548 in the condenser 534 is increased, thereby increasing a cooling capacity of the thermosiphon system 530 (e.g., allowing a liquid level of the working fluid 548 to increase in the evaporator 532). As the working volume 554 of the condenser 534 is increased, the saturation pressure/temperature of the working fluid 548 in the condenser 534 is decreased to decrease the liquid working fluid 548 in the evaporator 532, thereby decreasing a cooling capacity of the thermosiphon system 530.

By adjusting the working volume 554 of the condenser 534 (thereby adjusting a liquid level of working fluid 548 in the evaporator 532), the cooling capacity of the thermosiphon system 530 may more closely match the heat load of the electronic devices 524. By matching or closely matching the heat load, the thermosiphon system 530 may operate more efficiently, for example, operate closer to a dryout condition where all or most of the liquid working fluid 548 in the evaporator 532 is vaporized by the heat of the electronic devices 524. Further, the piston 552 may adjust a vibratory state of the condenser 534 (in addition to or alternatively with adjusting the working volume 554). As described above, vibration of the condenser 534 by the piston 552 (or of the evaporator 532 in alternative implementations) may increase a cooling capacity of the thermosiphon system 530 to match or more closely match a heat load of the electronic devices 524.

The thermosiphon system 530 may include a valve 541. The valve 541 may be similar to the valve 342 shown in FIGS. 4A-4B. For example, the valve 541 may be modulated (e.g. opened or closed) based, at least in part on measured or sensed parameters indicative of a heat load and/or power usage of the heat generating devices 524. In some implementations, by modulating the valve 541, a liquid level of the working fluid 548 in the evaporator 532 may be adjusted. By adjusting a liquid level of working fluid 548 in the evaporator 532, the cooling capacity of the thermosiphon system 530 may more closely match the heat load of the electronic devices 524.

Thermosiphon system 530 may also include, as shown, a wick material 564, shown in FIG. 5 in the condensate line 538. In some aspects, the wick material 564 may be selected based in part on an expected maximum heat load and/or power usage of the electronic devices 524, an expected actual (or average) heat load and/or power usage of the electronic devices 524, and/or other criteria. The wick material 564, in some aspects, may absorb a portion of the liquid working fluid 548 returned to the evaporator 532. By absorbing a portion of the liquid, thereby slowing a rate of flow of the liquid working fluid 548 to the evaporator, a liquid level of the working fluid 548 in the evaporator 532 may be controlled, thereby controlling a cooling capacity of the thermosiphon system 530.

As shown in FIG. 5, a controller (or control system) 544 may be communicably coupled to one or more temperature sensors (not shown, but similar or identical to sensors 146 shown on FIG. 2A), one or more pressure/liquid level sensors (not shown, but similar or identical to sensors 150 shown on FIG. 2A) located in the evaporator 532, one or more fans 526 (e.g., to control a speed or state of the fans 526), as well as other components, such as the actuator 542, the piston 552, and/or the valve 541. In some aspects, inputs into the controller 544 may be indicative of the heat load of the electronic devices 524. For example, the sensors may measure a temperature of the electronic devices 524 and/or the motherboard 522. Also, sensors may measure a temperature, pressure, and/or liquid level of the working fluid 548 in the evaporator 532. Although not specifically shown, temperature, pressure, and/or level of the working fluid 548 may be measured in the condenser 534 or vapor/condensate lines 536/538 as indicative of the heat load of the electronic devices 524. One or more operational parameters of the electronic devices 524 may also be measured by sensors that may be indicative of the heat load of the electronic devices 524. For example, power usage (e.g., current, voltage, or power) of the electronic devices 524 may be measured and may be indicative of the heat load of the electronic devices 524. As another example, operational speed or frequency (e.g., Hz) of the electronic devices 524 may be measured and may be indicative of the heat load of the electronic devices 524. As another example, utilization (e.g., number of jobs executed or to be executed, or otherwise) of the electronic devices 524 may be measured and may be indicative of the heat load of the electronic devices 524.

Generally, the controller 544 may receive one or more inputs from sensors that sense or measure parameters associated with a heat load and/or power usage of the electronic devices. The controller 544 may use the sensed or measured parameters to control the actuator 542, the piston 552, and/or the valve 541 to control an amount of liquid working fluid 548 that flows to the evaporator 532 to, for example, better match a heat load of the electronic devices 524. In some aspects, the controller 544 may select one of the actuator 542, the piston 552, or the valve 541 to adjust the amount of liquid working fluid 548 that flows to the evaporator 532 based on, for instance, the sensed, measured, or determined heat load and/or power usage of the electronic devices 524.

In alternative aspects, the valve 541 may be mounted in the vapor line 536, in both vapor/condensate lines 536/538, or in a portion of the thermosiphon system 530 that is fluidly coupled to one or both of the vapor/condensate lines 536/538. In short, the valve 541 may be positioned in any appropriate location to control the liquid level of the working fluid 548 in the evaporator 532.

Figure 6A:
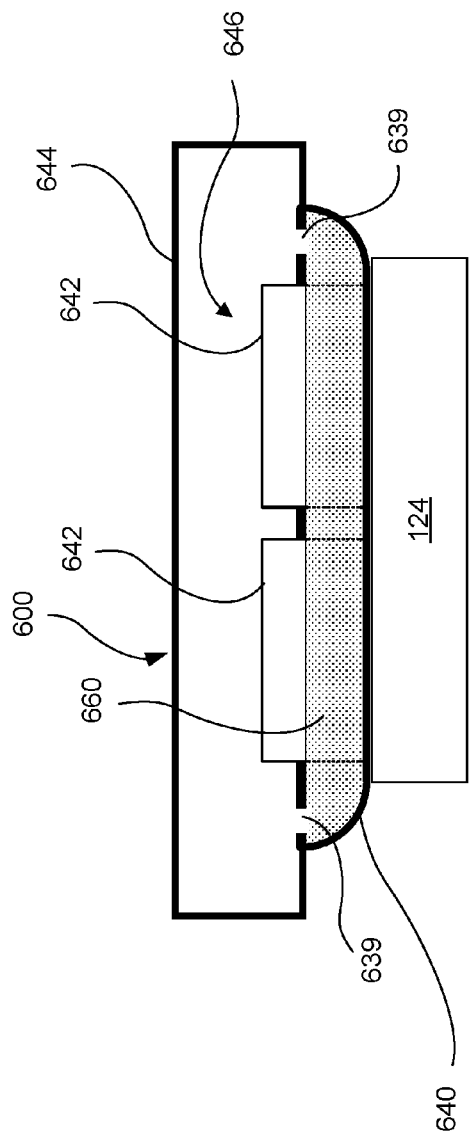
FIGS. 6A-6B illustrate schematic side and top views of a portion of a thermosiphon cooling system.
Figure 6B:
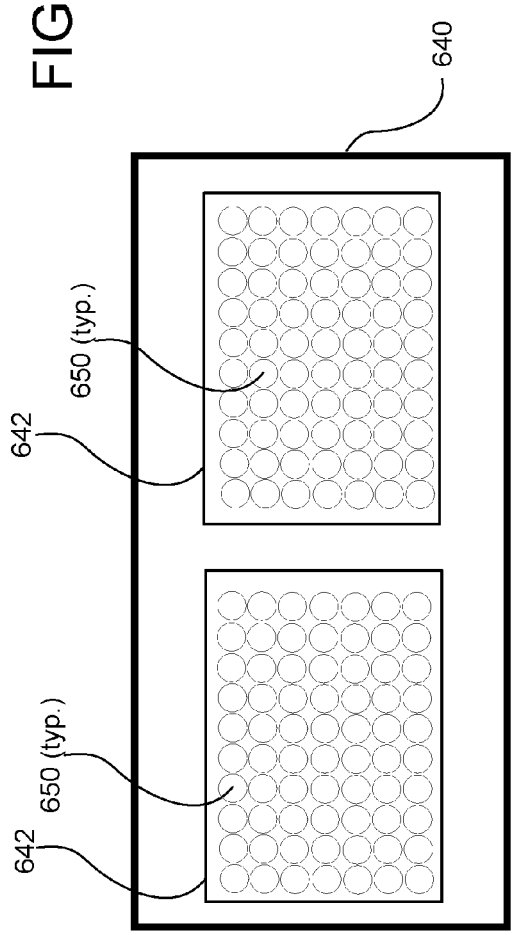

FIGS. 6A-6B illustrate schematic side and top views of a portion 600 of a thermosiphon cooling system, such as the thermosiphon systems 130, 230, 330, and/or 530. In some aspects, the portion 600 may be an evaporator 600 of a thermosiphon system as described above. As illustrated, the evaporator 600 includes a chamber 646 and heat transfer surfaces 642. The evaporator 600 includes a base 640 and a case 644 that is secured to the base 640. The case 644, in some aspects, can be provided by a tube of the condensate/vapor line (e.g., condensate/vapor line 136). A volume sealed above the base 640 inside the case 644 provides a chamber 646 for the evaporator 600. The top surface of the base 640 provides an evaporator pan. That is, the top surface of the base 640 includes a portion i) that is recessed relative to passages 639 in the case 644, and ii) in which a liquid phase of the working fluid 660 collects.

As illustrated, the heat transfer surfaces 642 project upwardly from the evaporator base 640 so that they are above the bottom of the case 640. When a liquid phase of the working fluid 660 overflows the evaporator pan of the base 640, it floods the bottom section of the chamber 646 defined by the case 640. Thus, the bottom of chamber 646 defined by the case 640 can be considered a floodplain. In addition, this ensures that the heat transfer surfaces 642 remain only partially submerged in the liquid phase of the working fluid 660.

The base 640 can be formed of the same material as the case 640, e.g., aluminum, or may be formed from a different thermally conductive material, e.g., copper. The bottom of the base 640 can directly contact the electronic device 124, e.g., the top surface of the electronic device 124. Alternatively, the bottom of the base 640, can be connected to the electronic device 124, e.g., the top surface of the electronic device 124, by a thermally conductive interface material, e.g., a thermally conductive pad or layer, e.g., a thermally conductive grease or adhesive.

The heat transfer surfaces 642, as shown, includes a plurality of fins 650 that contact the bottom interior surface of the housing, e.g., the top surface of the base 640. The evaporator fins 650 project upwardly from the pan of the evaporator base 640. Thus, the evaporator fins 650 provide a thermally conductive area that transfers heat from the base 640 to the working fluid 660. The tops of the fins 650 can project into the chamber 646 and can be arranged substantially in parallel rows, as shown. In some implementations, the fins 650 extend generally parallel to the width of the chamber 646.

In addition, the evaporator fins 650 can be configured to draw the working fluid 660 away from the base 640 by capillary action. For example, the evaporator fins 650 can be stamped or otherwise imprinted with features, e.g., grooving, which tends to draw the working fluid upward. In some implementations, the fins 650 can have undulations along their length. The undulations can have a pitch between 1 mm and 2 mm and an amplitude between 0.1 and 0.5 mm. These undulations can cause some of the liquid phase of the working fluid 660 to move up the fins 650 by capillary action. This can improve the efficiency of the evaporator 600 by exposing more of the surface area of the fins 650 to the liquid phase of the working fluid. The fins 650 can be constructed of the same material as the evaporator, e.g., aluminum. Alternatively, the fins 650 can be constructed of a different thermally conductive material, e.g., copper.

In the illustrated implementation, the fins 650 are integrally formed in the evaporator base 640 and thus, the base 640 and fins 650 are formed from a single material piece (e.g., copper or aluminum or other thermally conductive material). In some aspects, the integral nature of the fins 650 and the base 640, e.g., in contrast to separate fins or fin stacks that are brazed or otherwise connected to the evaporator base, may reduce a complexity of forming the evaporator 600. For example, the fins 650 may be formed with higher density and tighter tolerances relative to fins or fin stacks that are brazed or otherwise connected to the evaporator base 640. The higher density and tighter tolerances of the illustrated design may provide for improved heat transfer performance.

Figure 7:
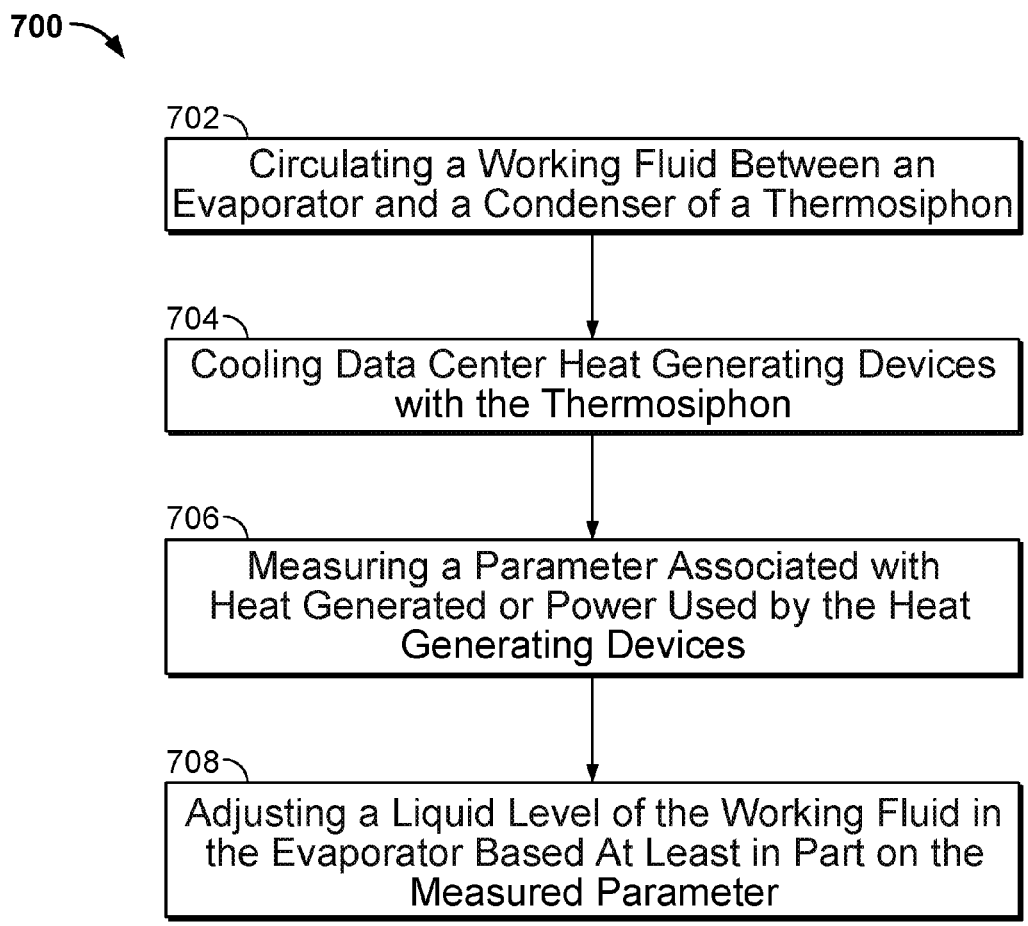
FIGS. 7-8 are flowcharts that illustrate example methods of cooling heat generating devices in a data center with a thermosiphon cooling system.
Figure 8:
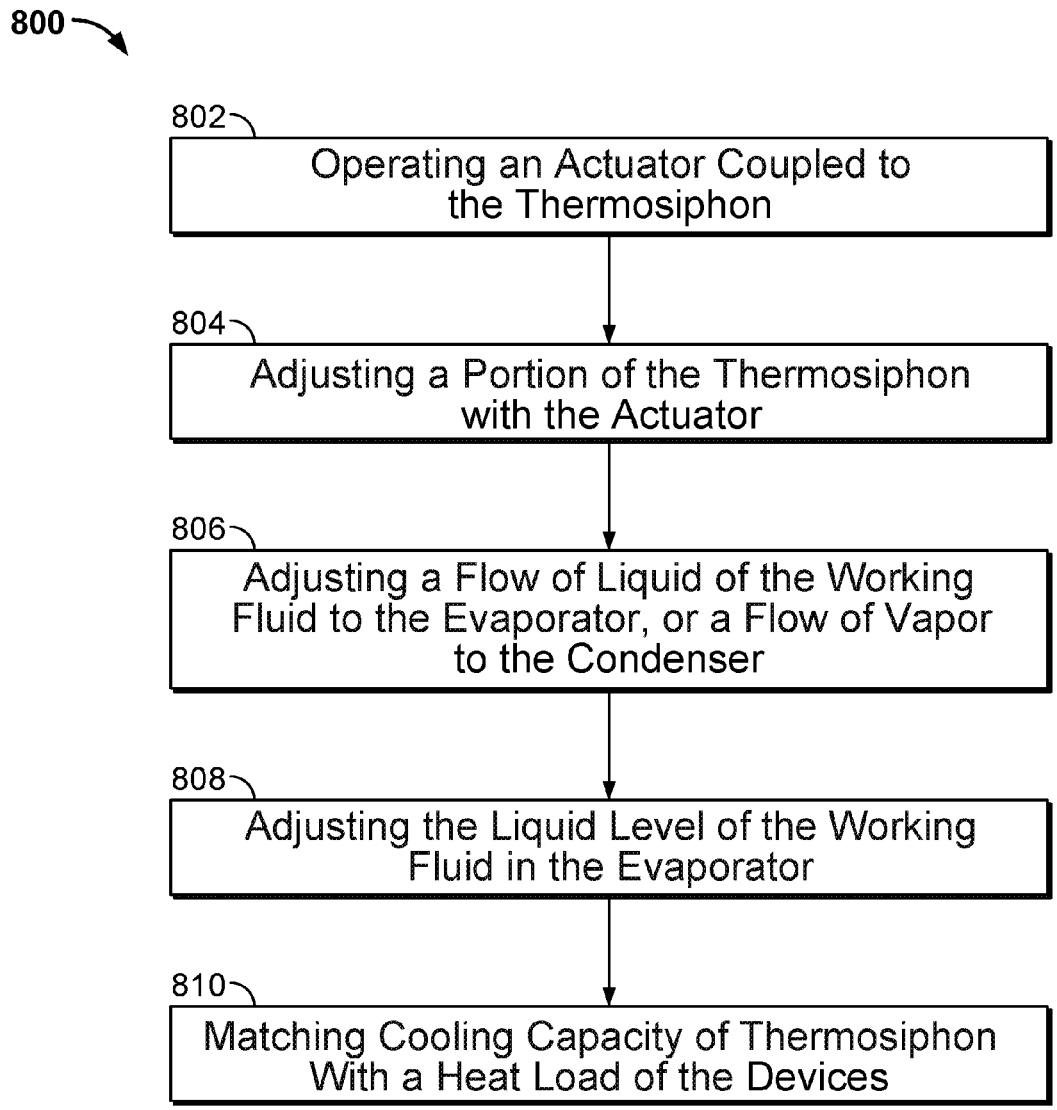

FIGS. 7-8 are flowcharts that illustrate example methods of cooling heat generating devices in a data center with a thermosiphon cooling system. Turning to method 700 shown in FIG. 7, this method may begin at step 702 by circulating a working fluid between an evaporator and a condenser of a thermosiphon that is mounted on a server tray sub-assembly. The working fluid may circulate from the evaporator to the condenser as a vapor. The working fluid may circulate (e.g., by gravity) from the condenser to the evaporator as a liquid.

Step 704 includes cooling the motherboard mounted electronic devices with the thermosiphon. For instance, heat energy is transferred from the one or more motherboard mounted electronic devices to a liquid working fluid in the evaporator (e.g., to vaporize the liquid). The heat energy is then moved, with the vaporized working fluid, to the condenser and released from the working fluid (e.g., to ambient air or airflow around the condenser). The working fluid condenses in the condenser to a liquid, which moves back to the evaporator.

Step 706 includes measuring a parameter associated with heat generated, or power used, by the electronic devices. The parameter may be sensed or measured and may directly sense/measure heat generated or power used by the electronic devices. The parameter may also indirectly sense/measure heat generated or power used by the electronic devices. For instance, the parameter may be a temperature of: the sub-assembly, a motherboard of the sub-assembly, one or more of the electronic devices, the thermosiphon, an air or airflow around the electronic devices or thermosiphon, or the working fluid. The parameter may be a pressure of the working fluid. The parameter may be a level of liquid working fluid in the evaporator. The parameter may also be a measured, estimated, predicated, or nameplate power (e.g., current, voltage, and/or wattage) usage of the one or more electronic devices. The parameter may also be a measured, estimated, or predicated utilization of the one or more electronic devices.

Step 708 includes adjusting a liquid level of the working fluid in the evaporator based, at least in part, on the measured or sensed parameter. In some aspects, an example implementation of step 708 may be performed according to method 800 shown in FIG. 8. For example, step 802 includes operating an actuator coupled to the thermosiphon. In some aspects, the actuator may be coupled to the condenser. For instance, in some aspects, the actuator may include a piston mounted within a working volume of the condenser, or a height adjustment assembly coupled to the condenser, or a vibration assembly coupled to the condenser. In some aspects, the actuator may include a valve positioned within a condensate line that returns liquid working fluid to the evaporator from the condenser.

Step 804 includes adjusting a portion of the thermosiphon with the actuator. For example, the actuator may adjust a vertical distance between the condenser and the evaporator (e.g., adjust a height of the condenser from the sub-assembly). In some aspects, the actuator may adjust a working volume of the condenser (e.g., with the piston). In some aspects, the actuator may adjust a flow of the liquid working fluid from the condenser to the evaporator (e.g., with a valve, wick material or otherwise). In some aspects, the actuator may vibrate the condenser or other portion of the thermosiphon in order to reduce a bubble size of the working fluid in the thermosiphon.

Step 806 includes adjusting a flow of liquid of the working fluid to the evaporator or flow of vapor to the condenser based on adjustment of the thermosiphon. Step 808 includes adjusting the liquid level of the working fluid in the evaporator based on adjustment of the flow of liquid of the working fluid to the evaporator or flow of vapor to the condenser. Step 810 includes matching a cooling capacity of the thermosiphon with a heat load of the electronic devices based on adjusting the liquid level of the working fluid in the evaporator.

In some implementations, matching (exactly or almost) the cooling capacity of the thermosiphon with the heat load of the electronic devices may allow for more efficient operation of the thermosiphon. For instance, a thermosiphon might operate most efficiently at a design cooling capacity, e.g., a dryout capacity where all or substantially all of the liquid in the evaporator is vaporized by heat energy transferred from the electronic devices. Such a design cooling capacity may be chosen, and indeed may be required, based on a maximum heat load of the electronic devices (e.g., corresponding to a maximum or nameplate power usage). However, since the electronic devices may not typically operate, and may never operate, at the nameplate power usage, the heat load of the electronic devices (e.g., average or actual) may be less than the maximum heat load. The design cooling capacity of the thermosiphon may therefore be too large, causing the thermosiphon to typically operate in a less efficient (or inefficient) state (e.g., with buildup of liquid working fluid in the evaporator). Operation of the actuator to adjust the thermosiphon to match (exactly or closely) a dynamic heat load of the electronic devices may thus allow the thermosiphon to be chosen for a maximum heat load (e.g., as the electronic devices operate at nameplate power) while still allowing for the most efficient operation at various heat loads less than the maximum heat load.

Figure 9:
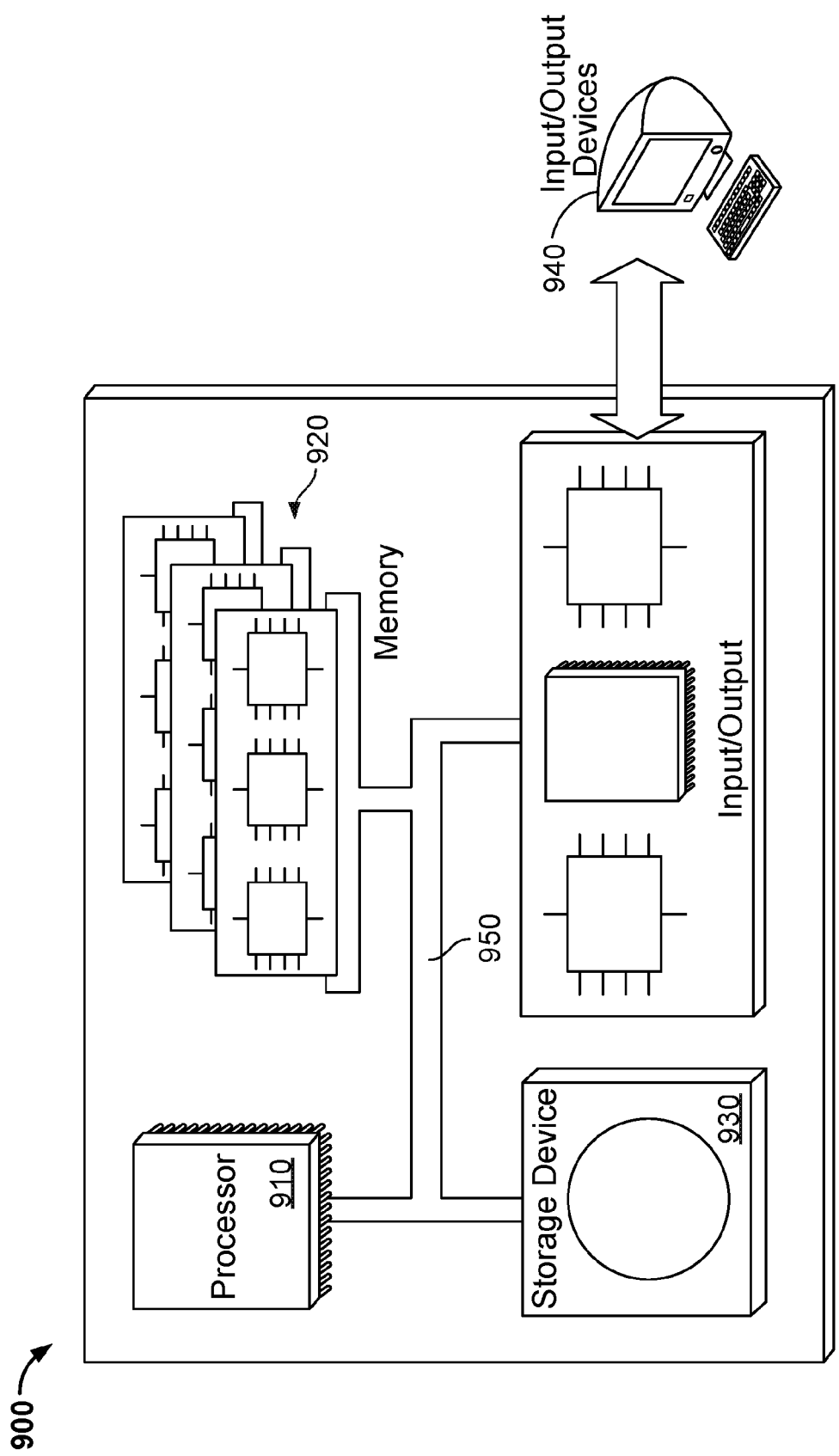
FIG. 9 is a schematic diagram of a computer system that can be used for the operations described in association with any of the computer-implemented methods described herein.

FIG. 9 is a schematic diagram of a control system (or controller) 900. The system 900 can be used for the operations described in association with any of the computer-implemented methods described previously, for example as or as part of the controllers 144/244/344 or other controllers described herein. For example, the system 900 may be used in providing local control for particular ones of or small groups of, combined power/cooling units described above, or in providing master control over an entire data center or multiple data centers of such units. Moreover, the system 900 may describe computing resources that may operate as the loads to be cooled by the systems and methods described above.

The system 900 is intended to include various forms of digital computers, such as laptops, desktops, workstations, personal digital assistants, servers, blade servers, mainframes, and other appropriate computers. The system 900 can also include mobile devices, such as personal digital assistants, cellular telephones, smartphones, and other similar computing devices. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The system 900 includes a processor 910, a memory 920, a storage device 930, and an input/output device 940. Each of the components 910, 920, 930, and 940 are interconnected using a system bus 950. The processor 910 is capable of processing instructions for execution within the system 900. The processor may be designed using any of a number of architectures. For example, the processor 910 may be a CISC (Complex Instruction Set Computers) processor, a RISC (Reduced Instruction Set Computer) processor, or a MISC (Minimal Instruction Set Computer) processor.

In one implementation, the processor 910 is a single-threaded processor. In another implementation, the processor 910 is a multi-threaded processor. The processor 910 is capable of processing instructions stored in the memory 920 or on the storage device 930 to display graphical information for a user interface on the input/output device 940.

The memory 920 stores information within the system 900. In one implementation, the memory 920 is a computer-readable medium. In one implementation, the memory 920 is a volatile memory unit. In another implementation, the memory 920 is a non-volatile memory unit.

The storage device 930 is capable of providing mass storage for the system 900. In one implementation, the storage device 930 is a computer-readable medium. In various different implementations, the storage device 930 may be a floppy disk device, a hard disk device, an optical disk device, or a tape device.

The input/output device 940 provides input/output operations for the system 900. In one implementation, the input/output device 940 includes a keyboard and/or pointing device. In another implementation, the input/output device 940 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of embodiments have been described. Nevertheless, it will be understood that various modifications may be made without departing from the spirit and scope of what is described. For example, the steps of the exemplary flow charts in FIGS. 7-8 may be performed in other orders, some steps may be removed, and other steps may be added. Further, in some implementations, a phase change material may be positioned, for example, between an evaporator of a thermosiphon and one or more heat generating electronic devices to increase a thermal contact area between the evaporator and the devices. Accordingly, other embodiments are within the scope of the following claims.

What is claimed is:

1. A server tray sub-assembly comprises:
    a motherboard;
    a plurality of heat generating electronic devices mounted on the motherboard;
    a thermosiphon mounted on the motherboard, the thermosiphon comprising:
        an evaporator in heat transfer communication with the plurality of heat generating electronic devices;
        a condenser fluidly coupled to the evaporator with a fluid conduit that slopes downward from the condenser to the evaporator; and
        a multi-phase fluid contained in the thermosiphon; and
    a control system comprising:
        a sensing device operable to sense a value associated with an amount of heat generated by the plurality of heat generating electronic devices; and
        an actuator operatively coupled to the thermosiphon to adjust an amount of the multi-phase fluid in the evaporator based, at least in part, on the sensed value.

2. The server tray sub-assembly of claim 1, wherein the actuator is operatively coupled to the condenser and is configured to adjust the condenser based, at least in part, on the sensed value.

3. The server tray sub-assembly of claim 2, wherein the actuator is configured to adjust at least one of a vertical distance between the condenser and the evaporator; a working volume of the condenser; or an angular position of the condenser relative to the motherboard.

4. The server tray sub-assembly of claim 2, wherein the actuator comprises a piston mounted in an interior volume of the condenser.

5. The server tray sub-assembly of claim 4, wherein the piston is configured to adjust a working volume of the condenser based, at least in part, on the sensed value.

6. The server tray sub-assembly of claim 1, wherein the actuator is configured to vibrate the condenser.

7. The server tray sub-assembly of claim 1, wherein the actuator is configured to adjust a flow of a liquid phase of the multi-phase fluid from the condenser to the evaporator based, at least in part, on the sensed value.

8. The server tray sub-assembly of claim 1, wherein the actuator comprises a valve arranged in a liquid line of the fluid conduit.

9. The server tray sub-assembly of claim 1, wherein the actuator comprises a wicking material mounted in a liquid line of the fluid conduit.

10. The server tray sub-assembly of claim 9, wherein the fluid conduit is flexible.

11. The server tray sub-assembly of claim 9, wherein the wicking material comprises an absorbent material.

12. The server tray sub-assembly of claim 11, wherein the absorbent material is configured to absorb a portion of a liquid phase of the multi-phase fluid.

13. The server tray sub-assembly of claim 1, wherein the sensed value comprises at least one of: a temperature of air adjacent the plurality of heat generating electronic devices, a temperature of air adjacent the condenser, a temperature of the plurality of heat generating electronic devices, a temperature of the motherboard, a liquid level of the multi-phase fluid in the evaporator, a pressure of the multi-phase fluid, a temperature of the multi-phase fluid, a power usage of the plurality of heat generating electronic devices, a frequency of one or more of the plurality of heat generating electronic devices, or a utilization of one or more of the plurality of heat generating electronic devices.

14. The server tray sub-assembly of claim 1, wherein the fluid conduit comprises copper or aluminum.

15. The server tray sub-assembly of claim 1, further comprising a fan mounted to the motherboard.

16. The server tray sub-assembly of claim 15, wherein the fan is configured to circulate airflow across the condenser.

17. The server tray sub-assembly of claim 16, further comprising an enhanced heat transfer surface coupled to the condenser.

18. The server tray sub-assembly of claim 17, wherein the fan is positioned on the motherboard to circulate the airflow across the enhanced heat transfer surface coupled to the condenser.

19. The server tray sub-assembly of claim 1, wherein the plurality of heat generating electronic devices comprise at least one data center server device.

20. The server tray sub-assembly of claim 19, wherein the at least one data center server device comprises a processor.

* * * * *

UNITED STATES PATENT AND TRADEMARK OFFICE
CERTIFICATE OF CORRECTION

| | |
|---|---|
| PATENT NO. | : 9,961,803 B2 |
| APPLICATION NO. | : 15/359154 |
| DATED | : May 1, 2018 |
| INVENTOR(S) | : Samadiani et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 31 days.

Signed and Sealed this
Fifth Day of February, 2019

Andrei Iancu
*Director of the United States Patent and Trademark Office*